United States Patent
Mori et al.

(10) Patent No.: US 6,794,849 B2
(45) Date of Patent: Sep. 21, 2004

(54) BATTERY, BASED POWER SUPPLY DEVICE AND ASSOCIATED MAINTENANCE SYSTEM

(75) Inventors: Iichiro Mori, Itami (JP); Koichi Toriyama, Moriguchi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/220,584

(22) PCT Filed: Mar. 1, 2001

(86) PCT No.: PCT/JP01/01593
§ 371 (c)(1),
(2), (4) Date: Sep. 30, 2002

(87) PCT Pub. No.: WO01/65627
PCT Pub. Date: Sep. 7, 2001

(65) Prior Publication Data
US 2003/0137277 A1 Jul. 24, 2003

(30) Foreign Application Priority Data

| Mar. 1, 2000 | (JP) | 2000-056317 |
| Aug. 9, 2000 | (JP) | 2000-241650 |
| Aug. 9, 2000 | (JP) | 2000-241651 |
| Aug. 9, 2000 | (JP) | 2000-241681 |
| Aug. 9, 2000 | (JP) | 2000-241682 |
| Aug. 9, 2000 | (JP) | 2000-241683 |

(51) Int. Cl.$^7$ ................................................. H02J 7/00
(52) U.S. Cl. ...................................................... 320/107
(58) Field of Search ................................. 320/107, 104, 320/106, 109; 707/1, 3, 10, 102; 700/231; 340/5, 40, 432; 324/434, 431, 433, 437

(56) References Cited

U.S. PATENT DOCUMENTS

| 5,694,019 A | * | 12/1997 | Uchida et al. | 320/106 |
| 6,008,652 A | * | 12/1999 | Theofanopoulos et al. | 324/434 |
| 6,115,712 A | * | 9/2000 | Islam et al. | 707/10 |
| 6,154,006 A | * | 11/2000 | Hatanaka et al. | 320/109 |
| 6,618,644 B2 | * | 9/2003 | Bean | 700/231 |

FOREIGN PATENT DOCUMENTS

| JP | 08-185214 | 7/1996 |
| JP | 08-185890 | 7/1996 |
| JP | 09-153376 | 6/1997 |
| JP | 10-066266 | 3/1998 |
| JP | 10-116190 | 5/1998 |
| JP | 2000-181582 | 6/2000 |

* cited by examiner

Primary Examiner—Pia Tibbits
(74) Attorney, Agent, or Firm—Jordan and Hamburg LLP

(57) ABSTRACT

A portable personal computer (2) makes access to a service handling server (1) set up on the Internet (5), and transmits data from a power source monitor (4). The service handling server (1) identifies a model type of the personal computer (2), refers the received data to a power source information database (22), determines whether good or bad, transmits a reply notifying a determination result when there is no abnormality, and transmits abnormality action information using an e-mail when there is an abnormality.

23 Claims, 33 Drawing Sheets

Battery life evaluation result screen

Fig. 11

Battery replacement prompting message

| Replacement Part Notice | |
|---|---|
| Model name | PC-123456 |
| Device ID No. | 123-4567 |
| Replacement part name | Standard battery pack |
| Model type number | BP-123 |
| Price (consumption tax not included) | ¥6,000 |

[To order screen]

[Cancel]

[Other articles]

Fig. 12

Battery order processing screen

Battery Order Screen

| Replacement part name | Standard battery pack | Customer name | Taro Matsushita |
| --- | --- | --- | --- |
| Model type number | BP-123 | Customer address Phone number | 1006 Oaza Kadoma, Kadoma-shi, Osaka-fu TEL 06-6994-4753 |
| Order quantity | 1 pc. | Preferred date of delivery | May 20, 1996 |
| Delivery | Home delivery service | Total (Consumption tax, shipping and handling included) | ¥6,300 |
| Payment | Credit card | | |

[Cancel] [Order]

[Other articles]

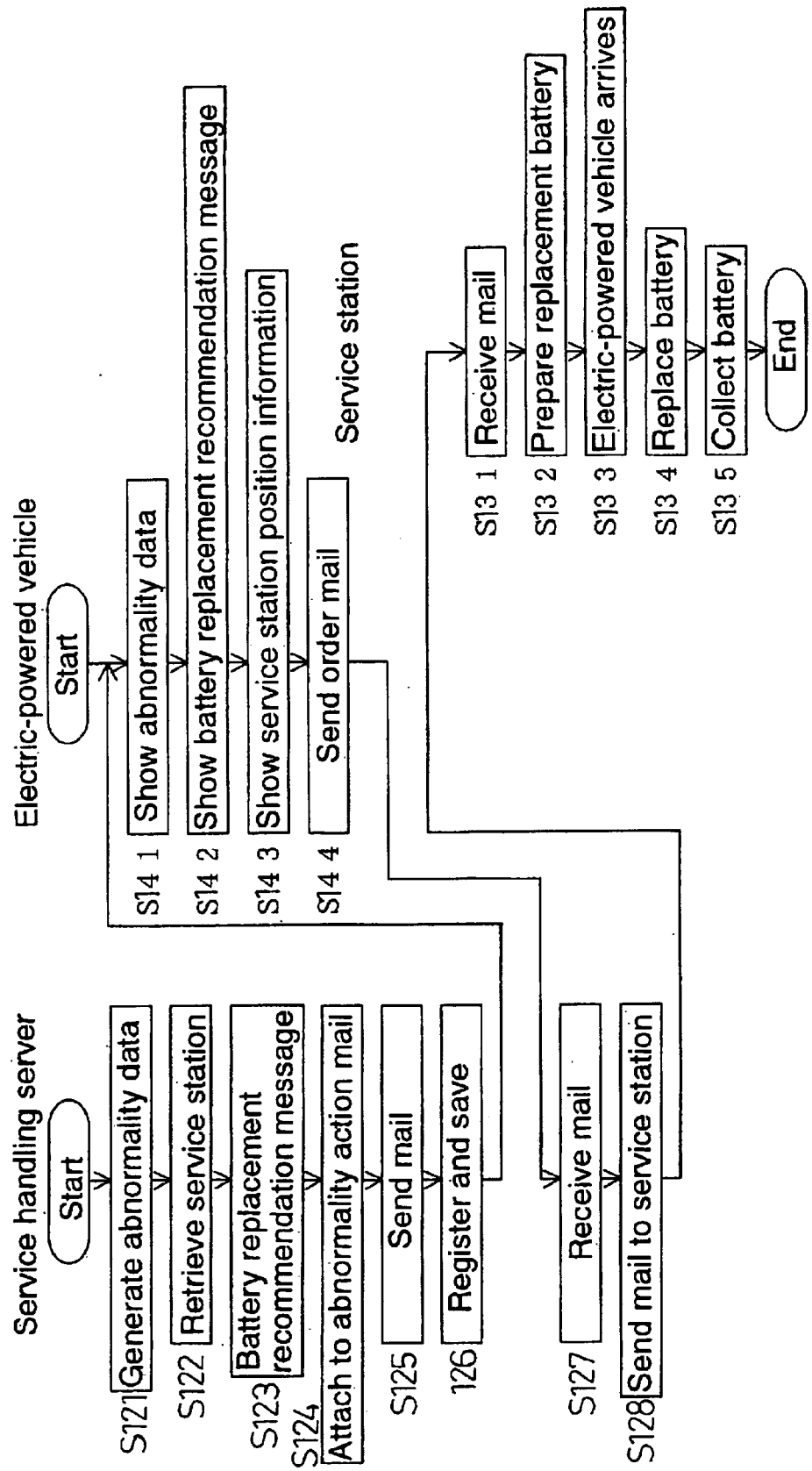

Fig. 18

Battery replacement prompting message

```
┌─────────────────────────────────────┐
│      Replacement Part Notice        │
│                                     │
│  Model name      [PC-123456]        │
│                                     │
│  Device ID No.   [123-4567]         │
│                                     │
│  Replacement     [Rechargeable      │
│  part name        battery]          │
│                                     │
│  Model type      [BP-123]           │
│         number                      │
│  Price                              │
│  (consumption     [¥6,000]          │
│  tax not included)                  │
│                                     │
│                  [To order screen]  │
│                                     │
│                  [   Cancel     ]   │
│                                     │
│                  [ Other articles ] │
│                                     │
└─────────────────────────────────────┘
```

BATTERY, BASED POWER SUPPLY DEVICE AND ASSOCIATED MAINTENANCE SYSTEM

TECHNICAL FIELD

The present invention relates to a maintenance service system for a battery and a power source device where an electronic device provided with a connection function for connecting with a communication network operates as a client device, and a service handling server set up on the communication network in correspondence with the client device maintains a battery or a power source device connected with the client device through the communication network.

BACKGROUND ART

A battery power source device applied to a portable personal computer (a portable PC, hereafter) and the like is generally constituted as a smart battery system which is provided with a rechargeable battery and a battery monitor function for monitoring the battery voltage, the battery temperature, the remaining capacity, and the like in addition to a battery protection function for protecting the rechargeable battery from an over charge and an over discharge, and is connected with a PC main unit with communication means typified by SMBus (System Management Bus). The PC main unit uses this smart battery system to always monitor the operation state of the battery power source device, and enhances a power management system which conducts power save control, and prevents data crash caused by an unexpected power drop from occurring.

The portable PC is constituted such that it can also operates on an AC power source. The AC power source is also necessary for charging the rechargeable battery, and power source monitoring means provided for the PC main unit comprehensively monitors the battery power source and the AC power source, and comprehensively controls switching between the battery power source and the AC power source, and charging the rechargeable battery.

While data such as the remaining capacity of the rechargeable battery can be obtained from the portable PC, it is difficult for a user to determine the state of the battery power source device based on the data. For example, while degradation of the rechargeable battery progresses as charging and discharging is repeated, and the lifetime consequently expires, it is not easy for the user to properly detect a state leading to the life expiration, and to replace the battery before the operation stops. As the rechargeable battery gets degraded, the device may become inoperable to the contrary of the user's expectation. A maintenance service system which determines a failure state of the battery power source device, and the battery monitor function for monitoring the charging and discharging states of the battery power source device is expected.

When an electric power interruption or an accident causes a power source trouble, risk of the data crash on a computer network increases as the size of the computer system increases. An uninterruptible power supply is used to prevent the data crash caused by the power source trouble. Uninterruptible power supplies individually connected with a personal computer are widely used as well as those used in the computer networks. The uninterruptible power supply is constituted using a rechargeable battery, and the rechargeable battery is charged using an AC power source. When the AC power source is interrupted by a power failure, a DC power of the rechargeable battery is transformed into an AC power for supplying for a computer to prevent a data crash caused by an interruption of the AC power source.

A handset of a cordless telephone operates on a rechargeable battery, and is constituted for a phone call while freely moving around. The handset is placed on a battery charger when it is not used in a standby time, and the rechargeable battery is charged in this period.

Though the rechargeable batteries for the uninterruptible power supply and the handset of the cordless telephone are used repeatedly after charging, the degradation progresses as the rechargeable batteries are repeatedly charged and discharged, and the rechargeable batteries consequently reach the life expiration. Though it is necessary to properly detect the state leading to the life expiration, and to replace the battery before it becomes inoperable, it is not easy for a user to determine the life expiration of the rechargeable battery. The period to the life expiration of the rechargeable battery varies according to the usage and the application environment in addition to repeated charging and discharging. Thus, a system for determining the degraded state of the rechargeable batteries of the uninterruptible power supply and the handset of the cordless telephone, and prompting a user to replace them has been expected. Especially, because the uninterruptible power supply secures a power source in case of emergency, and is not used in a normal state, it is necessary to monitor the degraded state of the rechargeable battery to avoid that the uninterruptible power supply has become inoperable.

Also, the rechargeable batteries are not widely available for purchase as dry batteries, and the replacement of them is not easy. It is necessary to replace with rechargeable batteries dedicated to the individual models of the uninterruptible power supply and the handset of the cordless telephone. It takes some time to receive the rechargeable batteries after ordering at a service center of the maker or a retailer in many cases. In this period, the user cannot use the device.

Electric vehicles which travel using rechargeable batteries as a power source, or hybrid vehicles which use both an engine and a motor are practically used, and it is considered that the share of these electric-powered vehicles as low emission vehicles among the entire vehicles will increase. Because an abnormality of the rechargeable battery on an electric-powered vehicle leads to inoperability of the vehicle, the charging and discharging state of the rechargeable battery is monitored. Though the rechargeable battery continues degrading due to repeated charging and discharging, and consequently reaches the life expiration, it is not easy to properly detect the state leading to the life expiration, and to replace the battery before the vehicle cannot travel.

The number of devices such as cellular phones, portable computers, portable audio devices, video cameras, and digital cameras which uses batteries as a power source for operation is increasing, and electronic control and electric operation for the portable devices have so progressed as even cameras for silver salt films which used to operate mechanically do not operate without a battery. In addition to these portable devices, batteries are used as a power source for devices operating indoors such as remote controllers and cordless telephones. Batteries are used for industrial devices such as electronic measuring instruments, and gas meters as well as these household devices.

Batteries are consumable, and the devices using the batteries as a power source become inoperable when the batteries are empty. Though rechargeable batteries are charged and used repeatedly, the degradation progresses because of the repeated charging and discharging, and consequently the rechargeable batteries are inoperable. Empty batteries not only cause inoperability of devices, but also generate a serious damage such as a data crash in a computer and the like. Thus, it is necessary to precisely check the state of batteries.

A battery checker is known as a device for checking the state of a battery, and ranges from a simple device for evaluating the state of a battery based on a terminal voltage, to a device for measuring an internal resistance of a battery to evaluate the state of the battery. However, there are many different types of batteries, and it is impossible to precisely evaluate the batteries when many different types of batteries are inspected in a unified way as the conventional battery checker. It is necessary to evaluate a battery based on data on the operation state obtained from an inspection procedure corresponding to the type of the battery.

An object of the present invention is to provide a maintenance service system for a battery and a power source device which uses a service handling server set up on a communication network for receiving data on operation states of the battery and the power source device, and providing a user with information on maintenance.

DISCLOSURE OF THE INVENTION

A maintenance service system for a power source device according to a first aspect of the present invention includes an electronic device serving as a client device provided with power source monitoring means for monitoring an operation of a power source device, and a connection function for connecting with a communication network, and a service handling server set up on the communication network corresponding to the client device, wherein the client device makes access to the service handling server through the communication network, and forwards data from the power source monitoring means, and identification information for identifying a model type, and the service handling server refers the forwarded data to databases provided in advance for the individual model types of the client devices identified by the identification information for determining the operation state, and returns a determination result and action information in case of detecting an abnormality to the client device. With this constitution, because the client device transmits the data on the power source device through the communication network to the service handling server, and a user can obtain information corresponding to the transmitted data, it is possible to determine an abnormal state of the battery power source and the battery monitoring function for monitoring the charging and discharging state of the battery power source, and to know information such as a replacement time of the battery, and an abnormality in power consumption.

A maintenance service system for a power source device according to a second aspect of the invention is a maintenance service system including an electronic device serving as a client device having a connection function for connecting with a communication network, and a service handling server set up on the communication network corresponding to the client device, for maintaining a power source device provided for the client device through a connection of the client device with the service handling server via the communication network, wherein at least a battery power source constitutes the power source device, power source monitor means monitors an operation of the power source device, and provides operation state data on request from the client device, the client device is provided with display means and memory means for storing identification information for identifying a model type, the service handling server is provided with databases for the power source devices for the individual model types of the client devices, an information processor for referring the provided operation state data to the database, and determining the appropriateness of the operation state, and a reply information generator for generating reply information, the client device starts a maintenance operation program, uses the network connection function to make access to the service handling server via the communication network, and transmits the operation state data extracted from the power source monitor means, and the identification information extracted from the memory means to the service handling server, the service handling server identifies a corresponding model type based on the identification information, uses the information processor to refer the operation state data to the database corresponding to the model type for determining the operation state of the power source device, uses the reply information generator to generate a determination result and action information in case of detecting an abnormality, and transmits them to the client device, and the client device conducts a maintenance operation based on the received action information. Because the service handling server provides the action information corresponding to the operation state data of the power source device, a user can properly maintain and use the power source device based on the reply information.

A maintenance service system for a power source device according to a third aspect of the invention includes an electronic device serving as a client provided with a battery power source device using a rechargeable battery, battery management means for managing an operation state of the battery power source device, and connection means for connecting with a communication network, and a service handling server set up on the communication network corresponding this electronic device, wherein the electronic device makes access to the service handling server via the communication network, and transmits operation state data of the battery power source device extracted from the battery management means, the service handling server determines whether it is necessary to replace the battery power source device based on the transmitted operation state data, and transmits replacement processing information to the electronic device if it is determined that the replacement is necessary as a result, a user of the electronic device transmits order information specified in the replacement processing information to the service handling server when the user wants the replacement of the battery power source device, and the service handling server instructs a service station to deliver a battery power source device, and to collect the used battery power source device based on the order information, and simultaneously instructs a payment settlement station to settle the payment. Because the connection with the service handling server via the communication network allows the evaluation of the operation state of the battery power source device, it is possible to prepare for the replacement before the electronic device stops functioning as a result of a degradation or a failure, obtaining the dedicated battery power source device becomes easy, and the used battery power device is surely collected.

A maintenance service system for a power source device according to a fourth aspect of the invention includes an electronic device serving as a client provided with a battery power source device using a rechargeable battery, battery management means for managing an operation state of the battery power source device, identification information memory means for storing identification information for identifying a model type, and connection means for connecting with a communication network, and a service handling server set up on the communication network corresponding to the electronic device, wherein the electronic device uses the network connection means to connect with the service handling server via the communication network when a maintenance operation program starts, and transmits operation state data extracted from the battery management means, and identification information read out from the identification information memory means to the service handling server, the service handling serve is provided with databases corresponding to model types of the electronic devices and the battery power source devices, an information processor for referring the provided operation state data to the database, and evaluating the operation state, and a reply information generator for generating reply information, identifies corresponding model types based on the identification information received from the electronic device, uses the information processor to refer the operation state data to the databases corresponding to the model types, and to evaluate the operation state of the battery power source device, determines whether it is necessary to replace the battery power source device based on the evaluation result, uses the reply information generator to generate evaluation data and an order notice if it is determined that it is necessary to replace the battery power source device, and transmits them to the electronic device, a user of the electronic device transmits order information based on the order notice to the service handling server when the user wants to replace the battery power source device, and the service handling server forwards the order information to a replacement service station to instruct a delivery of a battery power source device for replacement, and simultaneously transmits the order information to a payment settlement organization to instruct the settlement of the payment.

A maintenance service system for a battery according to a fifth aspect of the invention includes an electric-powered vehicle serving as a client provided with a rechargeable battery, battery management means for monitoring an operation state of this rechargeable battery, identification information memory means for storing identification information for identifying a vehicle model, and network connection means for connecting with a communication network, and a service handling server set up on the communication network corresponding to the electric-powered vehicle, wherein the electric-powered vehicle uses the network connection means to make access to the service handling server via the communication network, and transmits battery management information extracted from the battery management means, and the identification information extracted from the identification information memory means, and the service handling server refers the transmitted battery management information to databases provided in advance for the individual vehicle models for determining the operation state of the rechargeable battery, and transmits a determination result and action information in case of detecting an abnormality to the electric-powered vehicle. With the present system, because the service handling server diagnoses the operation state of the rechargeable battery of the electric-powered vehicle via the communication network, and provides the action information when an abnormality is detected, it is possible to avoid a situation where degradation of the rechargeable battery prevents the electric-powered vehicle from traveling.

A maintenance service system for a power source device according to a sixth aspect of the invention includes an electronic device serving as a client with which a battery power source device is connected, and is provided with a connection function for connecting with a communication network, and a service handling server is set up on the communication network corresponding to the electronic device, wherein the battery power source device is provided with a rechargeable battery, battery management means for managing the operation state of the rechargeable battery, and identification information memory means for storing identification information for identifying a model type, the electronic device is connected with the service handling server via the communication network, and transmits the operation state data and the identification information, the service handling server refers the transmitted operation state data to databases provided in advance for individual model types identified by the identification information for determining the operation state, and returns a determination result and action information in case of detecting an abnormality to the client device. When the electronic device is connected with the service handling server, the operation state data of the battery power source device are transmitted to the service handling server, and the operation state is determined. Thereby, the degraded state of the rechargeable battery of the battery power source device can be obtained, and an action is taken before the operation is disabled.

A seventh aspect of the invention provides a maintenance service system for a battery power source device including an electronic device provided with a battery power source device and a read/write device for a memory medium, an information device provided with a read/write device for the memory medium and a connection function for connecting with a communication network, and a service handling server set up on the communication network for the information device as a client, wherein the battery power source device is provided with a rechargeable battery, battery management means for managing an operation state of the rechargeable battery, and identification information memory means for storing identification information for identifying a model type, the electronic device uses the read/write device to record battery management information extracted from the battery management means, and the identification information extracted from the identification information memory means into the memory medium, the information device uses the connection function for connecting with the communication network to connect with the service handling server, and transmits the battery management information and the identification information read out from the memory medium through the read/write device to the service handling server when the memory medium is connected with the read/write device of the information device, the service handling server refers the transmitted battery management information to databases provided in advance for the individual model types, determines the operation state of the rechargeable battery, and returns a determination result and action information in case of detecting an abnormality to the information device. With the present system, because the electronic device which uses the battery power source device records the battery management information of the rechargeable battery into the memory medium, it is possible to transmit the battery management information to the information device through the memory medium. The information device uses the communication network connection function to make access to the service handling server set up on the communication network, and transmits the battery management information. The service handling server refers the battery management information to the databases provided in advance for the individual model types, determines the operation state of the rechargeable battery, and returns the determination result to the information device. Thus, the information device can obtain the state of the battery power source device of the electronic device.

A maintenance service system for a battery according to an eighth aspect of the invention includes a battery inspection device to be connected with a battery subject to inspection, a computer connected with the battery inspection device through information transmission means, and provided with connection means for connecting with a communication network, and a service handling server set up on the communication network for the computer serving as a client, wherein an inspection procedure corresponding to a product type of the battery connected with said battery inspection device is obtained into the battery inspection device from the service handling server through the computer, operation data on the battery inspected following the inspection procedure is transmitted to the service handling server through the computer, the service handling server determines whether the battery is good or bad based on the operation data, and transmits a determination result to the computer, and the computer shows the determination result on a display. With this inspection system, because the inspection is conducted following the inspection procedure corresponding to the product type of the battery to be inspected, an appropriate inspection is conducted. The operation state data of the battery obtained from the inspection are transmitted to the service handling server through the computer, and are evaluated according to the product type of the battery, the battery is inspected precisely.

A maintenance service system for a battery according to a ninth aspect of the invention includes: a battery inspection device provided with battery connection means to be connected with a battery subject to inspection, product type input means for entering product type information of the battery connected with the battery connection means, inspection information memory means for storing information necessary for the inspection, battery inspection means for using an inspection procedure program to inspect the battery, data detection means for detecting operation state data of the battery obtained by the inspection, and information transmission means for receiving and providing information; a computer provided with network connection means for connecting with a communication network, and information transmission means for providing and receiving information; and a service handling server set up on the communication network for the computer serving as a client, and provided with inspection procedure storage means for storing the inspection procedure programs for the individual product types of the batteries, a database for storing data for the individual product types of the batteries, and evaluation means for referring the operation state data of the battery to the database, and for evaluating the operation state, wherein the battery inspection device and the computer are connected with each other through the information transmission means of the each of them, the battery is connected with the battery connection means of the battery inspection device, the product type of the battery is entered from the product type input means, the information transmission means transmits the product type information to the computer, the computer uses the network connection means to connect with the service handling server, downloads the inspection procedure program corresponding to the product type from the inspection procedure storage means, and transmits the inspection procedure program to the battery inspection device through the information transmission means, the battery inspection device stores the inspection procedure program in the inspection information memory means, uses the inspection procedure program to inspect the battery connected with the battery connection means, uses the data detection means to detect the obtained operation state data of the battery, and uses the information transmission means to transmit the operation data to the computer, the computer connects with the service handling server for transmitting the operation state data, the service handling server uses the evaluation means to refer the transmitted operation state data to the database, evaluates the operation state of the battery, and transmits evaluation result to the computer, and the computer shows the evaluation result on a display. With this inspection system, when the product type of the battery subject to inspection connected with the battery connection means of the battery inspection device is entered from the product type input means, because the computer connects with the service handling server via the communication network, and downloads the inspection procedure program corresponding the product type, and the inspection is conducted according to the inspection procedure program, a proper inspection is conducted. The operation state data of the battery obtained from the inspection are transmitted to the service handling server through the computer, and are evaluated according to the product type of the battery, the battery is precisely inspected.

BRIEF DESCRIPTION OF THE DRAWINGS

FIG. 11 is a screen shot showing a display example of a battery replacement prompting message;

FIG. 12 is a screen shot showing a display example of a battery order processing screen;

FIG. 17 is a flowchart showing a procedure in case of detecting an abnormality;

FIG. 18 is a screen shot showing a battery replacement prompting message screen;

BEST MODE FOR CARRYING OUT THE INVENTION

The following will describe embodiments of the present invention for understanding while referring to the attached drawings. The following embodiments are embodied examples of the present invention, and do not limit the technical scope of the invention.

Figure 1:
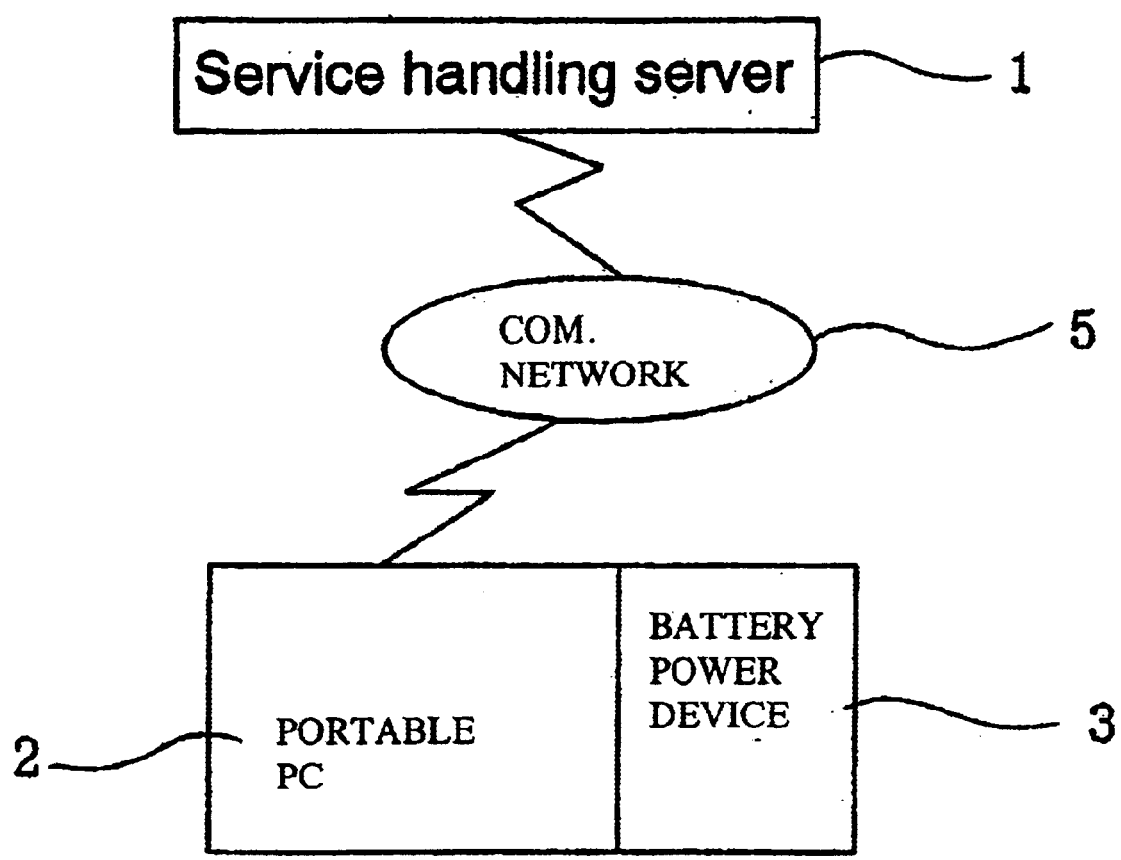
FIG. 1 is a block diagram showing a basic constitution of a maintenance service system for a power source device according to a first embodiment of the present invention.

A first embodiment of the present invention is a maintenance service system where a maker of portable personal computers (portable PCs hereafter) 2 sets up a service handling server 1 on the Internet (a communication network) 5 corresponding to different model types of the portable PCs (client devices) 2, the portable PC 2 uses an Internet connection function provided for the portable PC 2 to make access to the service handling server 1, and a maintenance service for a power source device provided for the portable PC 2 is provided as shown in FIG. 1.

The portable PC 2 can operate on a battery power source for an operation at a travel destination as well as operate on an AC power source. The portable PC 2 selectively uses a commercial power using an AC adaptor 11, and a battery power from a battery power source device 3 as shown in FIG. 2.

Figure 2:
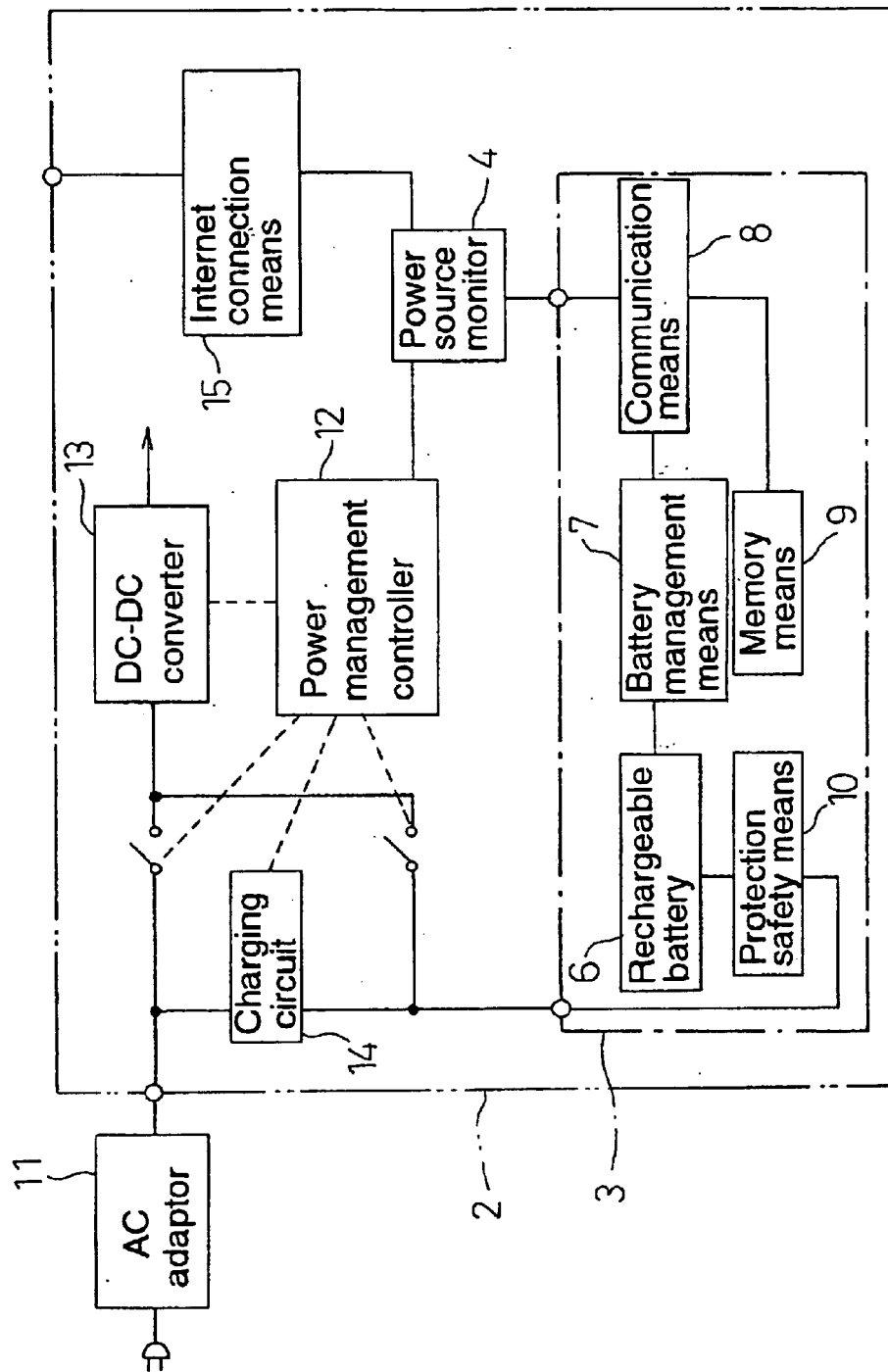
FIG. 2 is a block diagram showing a power source device constitution of a portable PC.

In FIG. 2, a power management controller 12 uses a control based on information on the battery power source device 3 and a PC main unit obtained through SMBus (communication means 8) to select between a DC output from the AC adaptor 11 and a DC output from the battery power source device 3. Simultaneously the controller 12 controls charging a rechargeable battery 6 using a charging circuit 14, and a DC-DC converter 13 for power management of the PC main unit when the AC power source is used.

Also, the battery power source device 3 is provided with the rechargeable battery 6, battery management means 7, communication means 8, memory means 9, and protection safety means 10, and constitutes a smart battery system along with the power management controller 12 and the charging circuit (a smart charger) 14. The battery management means 7 detects the battery voltage, the battery temperature, the remaining capacity, the charging and discharging cycle and the like, and provides them as outputs through the communication means 8 on request from the PC main unit.

A power source monitor 4 monitors the control operation of the power management controller 12, and the operation of the battery power source device 3 obtained through the communication means 8.

The portable type PC 2 is provided with Internet connection means 15 such as a modem. Resident software for the maintenance service starts a WWW browser 16 at a predetermined interval (such as once a day at an arbitrary time, or on a startup of the portable PC 2), and makes access to the service handling server 1. Then, a user ID (identification information) set and registered in advance, and power source information from the power source monitor 4 are transmitted to the service handling server 1.

Figure 3:
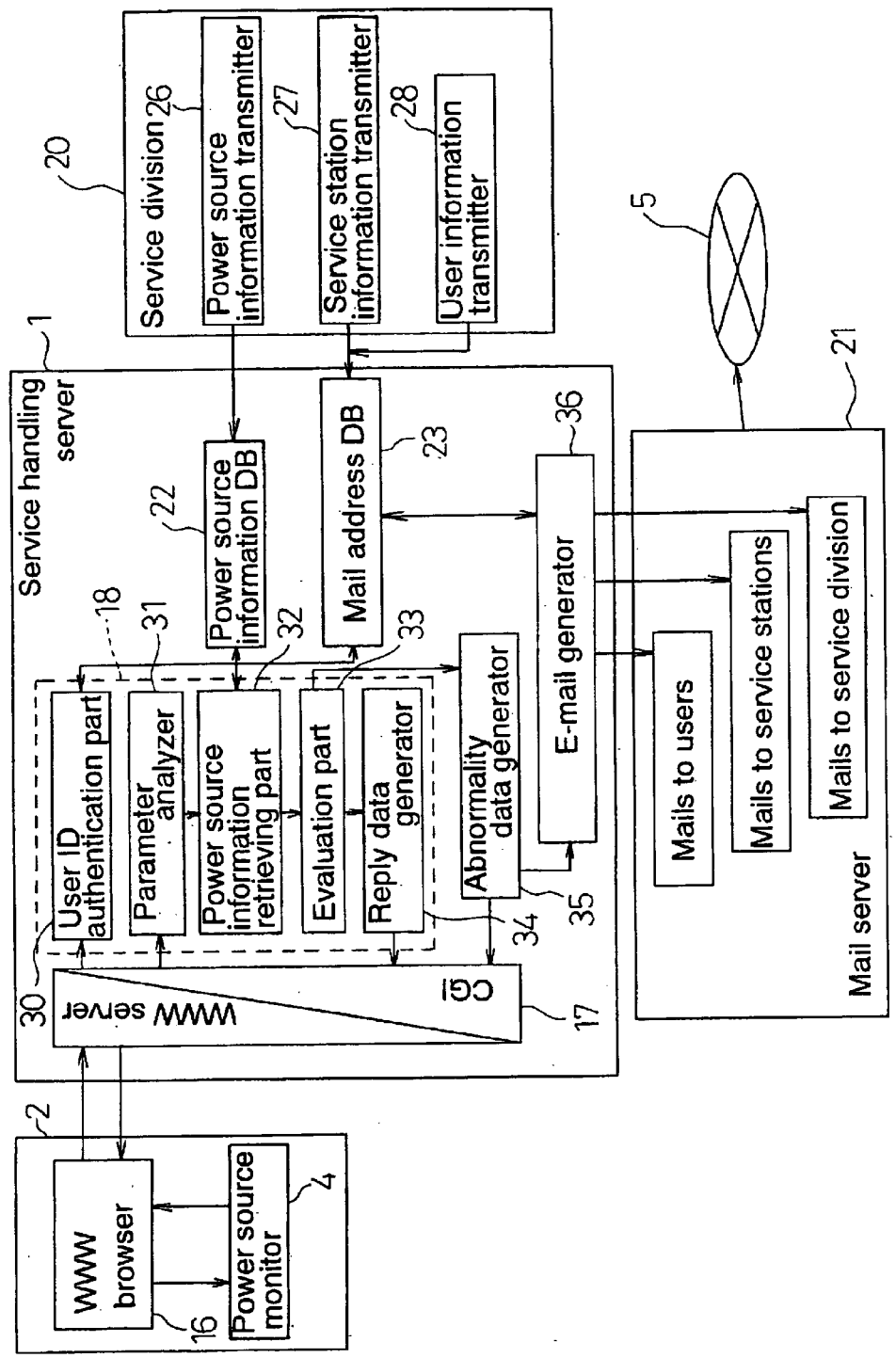
FIG. 3 is a block diagram showing a constitution of the maintenance service system.

On the other hand, the service handling server 1 processes the information transmitted from the portable PC 2, and returns reply information as shown in FIG. 3. A power source information DB (Database) 22 provided for the service handling server 1 stores the latest data transmitted from a power source information transmitter 26 of a service division 20. When a user purchases a portable PC 2, the user is registered. Then, registration data at this time are stored from a user information transmitter 28 of the service division 20 into a mail address DB 23 in the service handling server 1. Service stations are setup in individual areas for providing a maintenance service when an abnormality is detected, and information on the service stations is also stored from a service station information transmitter 27 of the service division 20 into the mail address DB 23. It is preferable to set up the service stations at such places as retailers and support centers of the portable PCs 2.

A WWW server/CGI 17 functions as an interface with the portable PC 2 serving as a client, receives information transmitted from the portable PC 2, and forwards a result of information processing as reply data to the portable PC 2. An information processor 18 conducts the information processing, and when an abnormality is detected, a mail server 21 transmits action information on the abnormality as e-mails (electronic mails) to individual locations.

Figure 4:
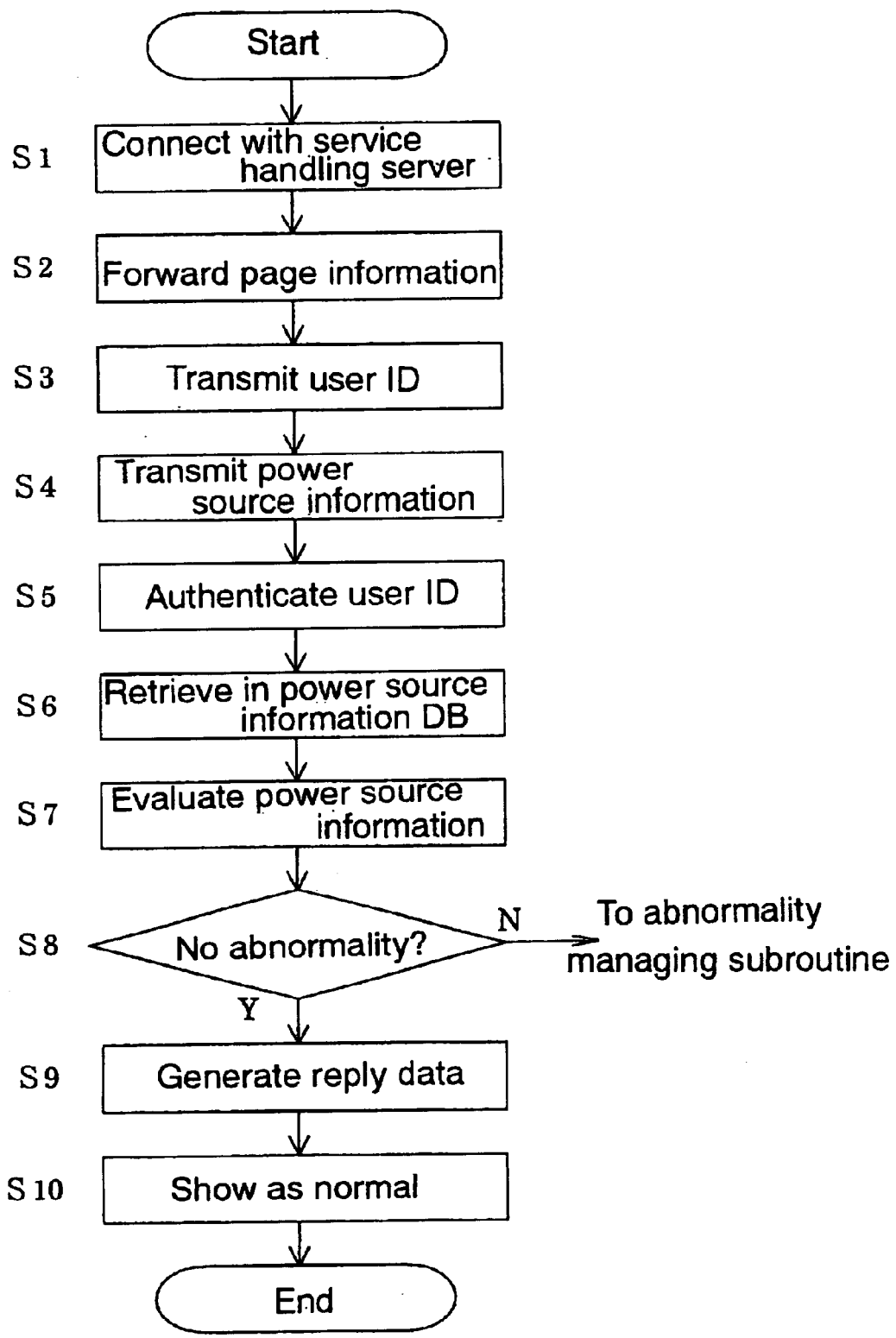
FIG. 4 is a flowchart showing a procedure of the maintenance service system.
Figure 5:
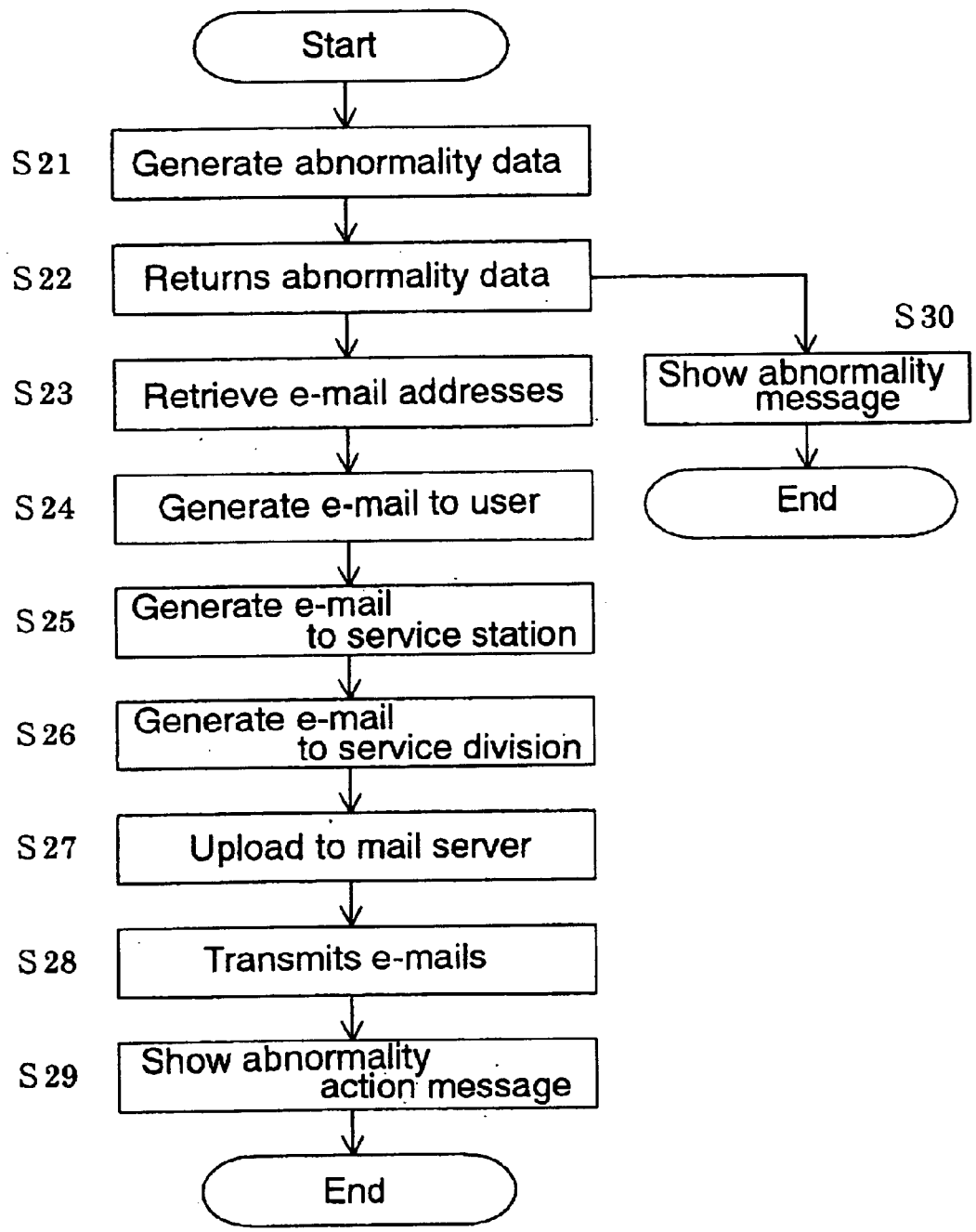
FIG. 5 is a flowchart showing a procedure in case of detecting an abnormality.

The following section describes maintenance service processing using the constitution above while referring to flowcharts in FIG. 4 and FIG. 5. S1, S2, . . . in the flowcharts are step numbers for indicating a processing procedure, and match numbers described in the following section.

In FIG. 4, the portable PC 2 uses the resident software to start the WWW browser 16 at a predetermined time, and connects with the service handling server 1 (S1). Then, page information on the maintenance service is transmitted (S2), a set user ID is transmitted (S3), and power source information is transmitted (S4). The access of the user to the service handling server 1 may not be automated by the resident software as described above, and the user may make access by his operation.

When the WWW server/CGI 17 receives the page information, the service handling server 1 makes the information processor 18 start. A user ID authentication part 30 refers the provided user ID to the mail address DB 23, and identifies the model types of the portable PC 2 used by the user, and the battery power source device 3 (S5). The information processor 18 uses a parameter analyzer 31 to process the data in the provided power source information, and creates evaluation object data. A power source information retrieving part 32 retrieves corresponding evaluation object data in a database for the identified model type in the power source information DB 22 (S6), and the evaluation part 33 evaluates the power source information (S7). Namely, because the power source information DB 22 stores normal values of the power source information, if the evaluation object data do not match in a predetermined range, it is determined as abnormal, and if they match, it is determined as normal (S8).

When the evaluation part 33 determines as normal, the reply data generator 34 generates a reply message indicating "Normal" (S9), the WWW server/CGI 17 transmits it to the portable PC 2, and a display "Normal" is shown on a display of the portable PC 2 (S10). On the other hand, if it is determined as "Abnormal" in Step S8, an abnormality handling subroutine shown in FIG. 5 is executed.

If it is determined as abnormal, an abnormality data generator 35 generates a reply message (S21), and it is transmitted to the portable PC 2 (S22) as shown in FIG. 5. As a result, an indication "Abnormal" appears on the display of the portable PC 2, and a notice indicating that information for managing the abnormality will be provided by an e-mail is displayed (S30). In the service handling server 1, an e-mail generator 36 retrieves mail addresses for the user and a service station from the mail address DB 23 (S23), and an e-mail to the user, an e-mail to the service station, and an e-mail to the service division are respectively generated (S24, S25, and S26). These e-mails are uploaded to the mail server 21 (S27), and the mail server 21 transmits the mails to the individual destinations (S28). A determination result from the service handling server 1 is transmitted to the service station along with information obtained from the user and the service division 20. The determination result from the service handling server 1 and information on the service station is transmitted to the service division 20 along with the information obtained from the user.

Because the action information against the abnormality appears on the display of the portable PC 2 of the user which receives the e-mail (S29), the user can follow the display content to manage the abnormality. Because the abnormality action information is transmitted to the service station as well, the service station may directly advise the user on how to handle the abnormality. While if the action against the abnormality is simple, showing an action message is enough. However, if the action is complicated and the amount of the information is large, it is possible to constitute such that actions against the individual types of abnormalities are stored as "Help" information in a maintenance program in advance, and a corresponding action is indicated, or it is also possible to constitute such that an executable program (or a file) for an emergency action is transmitted. Then, the user executes it for recovery.

As an example of the abnormality, when it is determined that the life of the rechargeable battery 6 is expiring based on data on the charging and discharging cycle, and a lapsed time after the purchase, because it is necessary to promptly replace the battery, a message for prompting the replacement of the battery may be shown as the action information via the e-mail. At the same time, an order reception screen may start for receiving an order. When an order is received from the order reception screen, the order is forwarded to the service station, and the service station orders a replacement battery. When it is determined that the power consumption of the portable PC 2 is abnormal, a message indicating "Abnormal device operation" may be transmitted, and a service reception screen may start for receiving a request for an inspection service. When a request for the inspection service is received, the service station provides a service such as sending service personnel.

Figure 6:
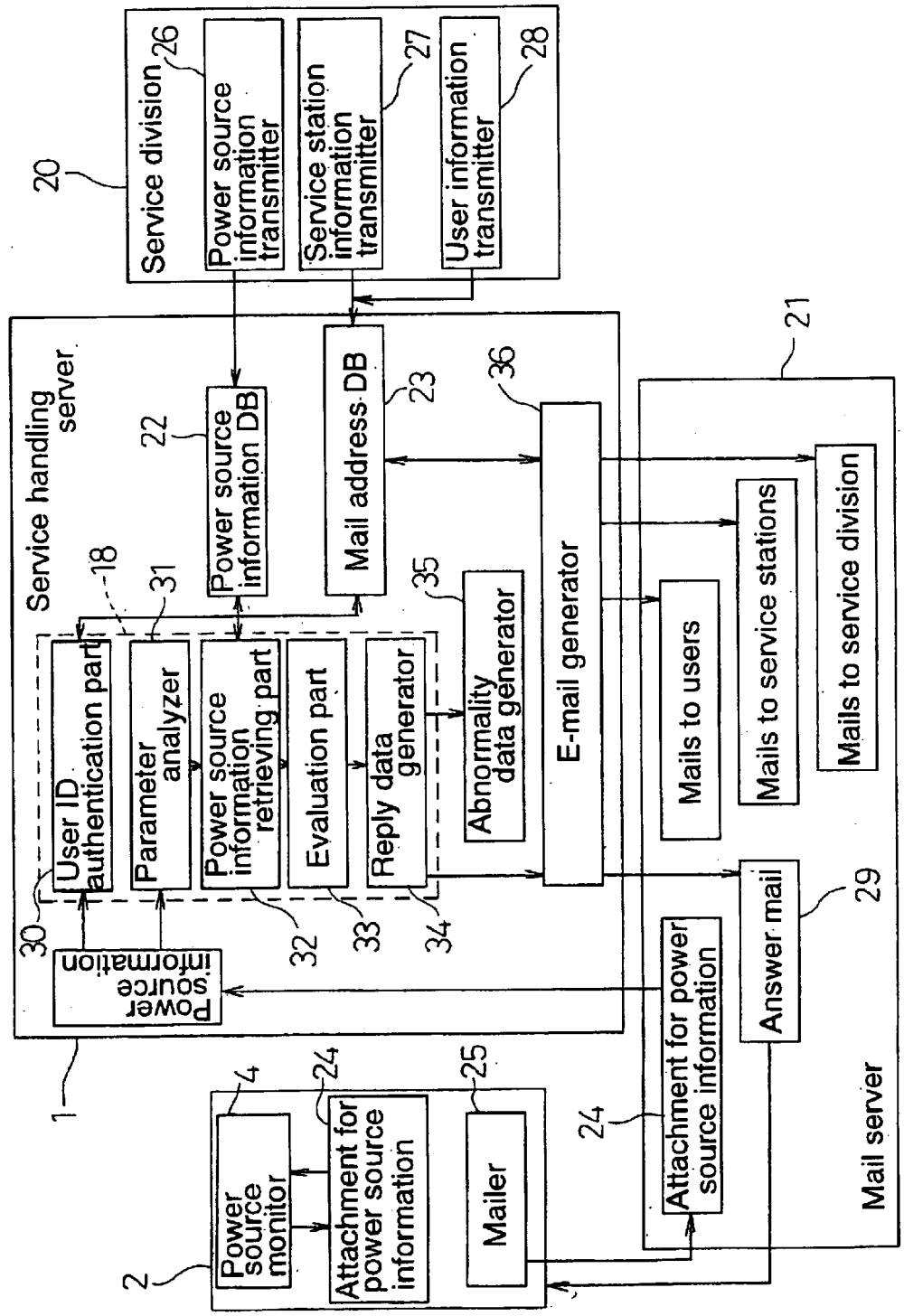
FIG. 6 is a block diagram showing a constitution in a case where an e-mail is used for transmitting data.

While the section above describes a case where the Internet is used, the maintenance service for the portable PC 2 may be provided by receiving and sending information via e-mails. As shown in FIG. 6, the portable PC 2 creates the user ID and the power source information as an attachment 24 to an e-mail, and uses a mailer 25 to transmit it to the mail server 21 through the Internet. When the mail server 21 receives the attachment 24, the mail server 21 opens it for forwarding it to the service handling server 1. When the service handling server 1 receives the power source information, it processes the information as described above, and sends an answer mail 29 indicating "Normal" to the portable PC 2 when there is no abnormality. Because this system is the same as the previously described system excepting that the portable PC 2 transmits data using an e-mail, the description for the system is omitted.

While the description above is provided for a case where the client device is the portable PC 2 provided with the Internet connection function, when the PC does not have the Internet connection function such as a modem, it is also obviously possible to connect with the Internet by inserting a modem PC card or the like into a PC card slot, or using a cellular phone or a PHS phone. A PDA (personal digital assistant) which can access to the Internet can serve as the client device in the same way.

In addition to the portable PC 2, a mobile communication device such as a cellular phone or a PHS phone having a connection function with a communication network may serve as the client device, and the service handling server 1 can provide the maintenance service for power source devices for them. When the battery management means 7 is provided for the battery power source device of the mobile communication device for detecting operation state data of it, and the operation state data are transmitted to the service handling server 1 through data communication service of the mobile communication device, the maintenance service can be provided as described above. For the mobile communication device, the service handling server may be set up in a base station for the mobile communication device.

The following section describes a second embodiment of the invention. Constitution elements common to the constitution elements in the first embodiment are assigned with the same numerals.

Figure 7:
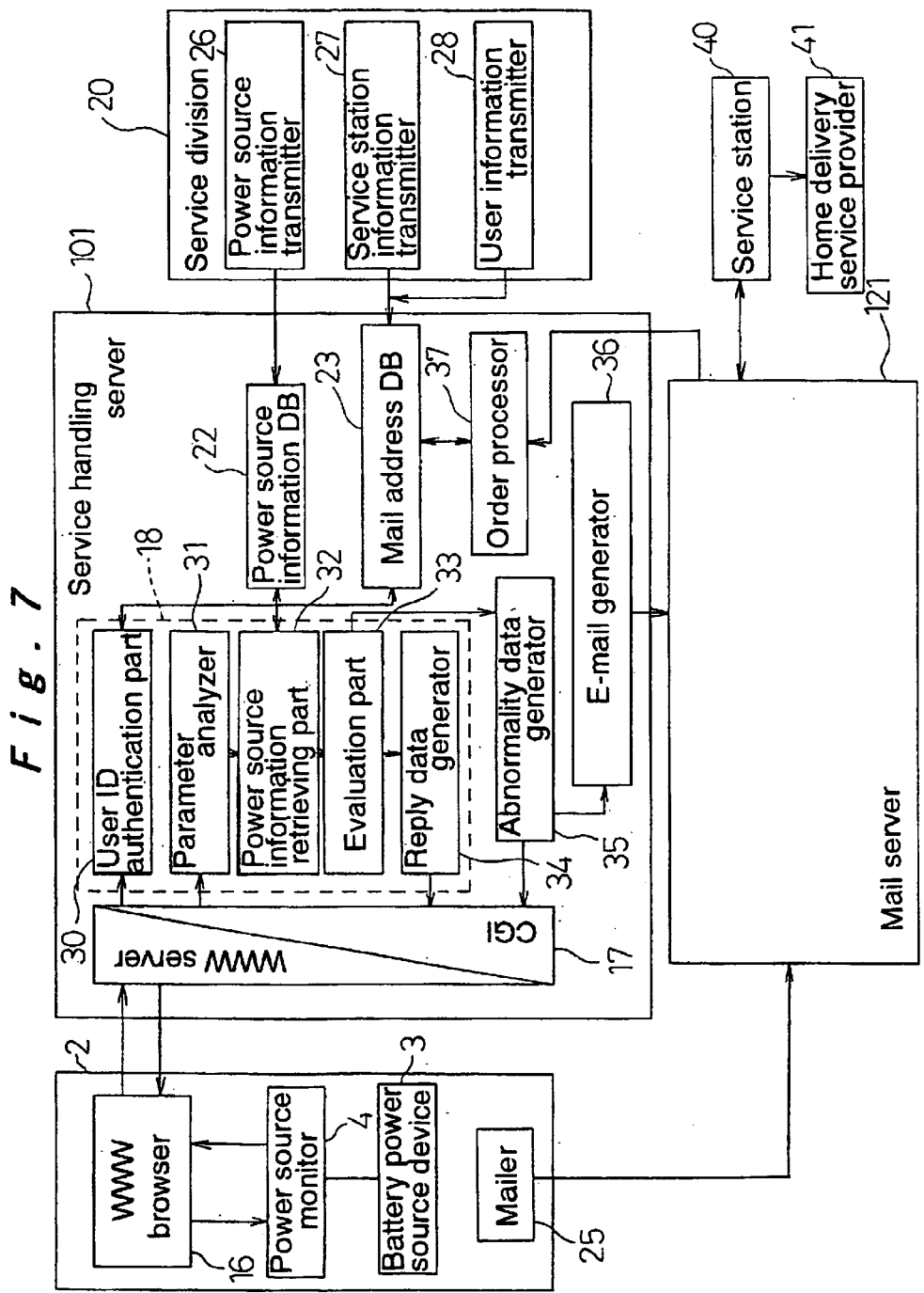
FIG. 7 is a block diagram showing a constitution of a maintenance service system according to a second embodiment of the invention.

As shown in FIG. 7, the second embodiment of the invention is a system where the portable PCs (electronic devices) 2 sold by a maker of the portable PC 2 serve as clients, the service handling server 101 is set up on the Internet (a communication network) 5 corresponding to the portable PCs 2, the portable PC 2 uses a provided Internet connection function to make access to the service handling server 101, an operation abnormality and a degradation state of the rechargeable battery are determined based on an operation state of the battery power source device 3 provided for the portable PC 2, and the battery power source device 3 is replaced and collected when there is an abnormality.

The portable PC 2 is constituted such that it operates on a battery power source for an operation at a travel destination as well as operates on an AC power source. The portable PC 2 is constituted such that it selectively uses a commercial power using an AC adaptor 11, and a battery power from the battery power source device 3. The power management controller 12 detects the connection of the AC adaptor 11 by a user to select between a DC output from the AC adaptor 11 and a DC output from the battery power source device 3. Simultaneously the controller 12 controls charging the rechargeable battery 6 using the charging circuit 14, and the DC-DC converter 13 for power management of the main unit of the PC when the AC power source is used as shown in FIG. 2.

The battery power source device 3 is provided with the rechargeable battery 6, the battery management means 7, the communication means 8, the memory means 9, and the protection safety means 10, and constitutes a smart battery system along with the power management controller 12 and the charging circuit (a smart charger) 14. The battery management means 7 always detects battery management information (operation state data) such as the battery voltage, the battery temperature, the remaining capacity, and the charging and discharging cycle of the rechargeable battery 6. The protection safety means 10 protects the rechargeable battery 6 from over charge and over discharge, and the rechargeable battery 6 is charged and discharged through the protection safety means 10. The memory means 9 is a memory to, which the identification information such as a serial number and a maker name of the battery power source device 3 are written. The communication means 8 provides the power source monitor 4 with the battery management information on the rechargeable battery 6 detected by the battery management means 7, and the identification information stored in the memory means 9 on request from the PC main unit.

The potable type PC 2 is provided with Internet connection means 15 such as a modem. Resident software for the maintenance service starts the WWW browser 16 at a predetermined interval, and the portable PC 2 makes access to the service handling server 101. Then, a user ID set and registered in advance, the battery management information extracted from the battery management means 7, and the identification information read out from the memory means 9 are transmitted to the service handling server 101.

On the other hand, the service handling server 101 processes the information transmitted from the portable PC 2, and returns answer information as shown in FIG. 7. The power source information DB 22 provided for the service handling server 101 stores the latest data for the individual model types transmitted from the power source information transmitter 26 of the service division 20. When a user purchases a portable PC 2, the user is registered. Then, registration data at this time are stored into the mail address DB 23 in the service handling server 101 from the user information transmitter 28 of the service division 20. Service stations are setup in individual areas for providing replacement service when an abnormality is detected, and information on the service stations is also stored in the mail address DB 23 from the service station information transmitter 27 of the service division 20. It is preferable to set up the service stations at such places as retailers and support centers of the portable PCs 2.

The WWW server/CGI 17 functions as an interface with the portable PC 2 serving as a client, receives information transmitted from the portable PC 2, and forwards a result of information processing as reply data to the portable PC 2. The information processor 18 conducts the information processing, and when an abnormality is detected, a mail server 121 transmits action information on the abnormality as e-mails (electronic mails) to individual locations.

Figure 8:
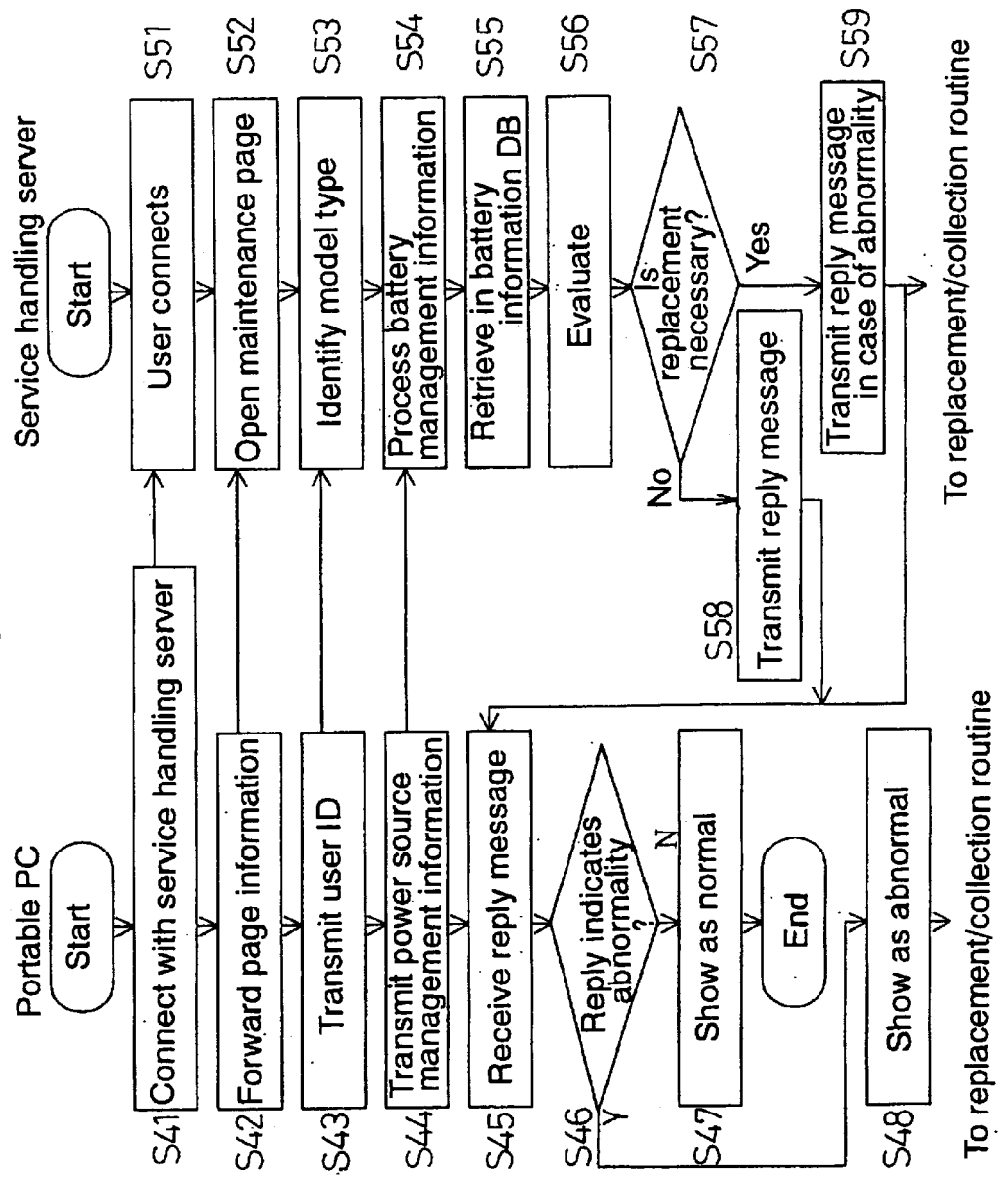
FIG. 8 is a flowchart showing a procedure of the maintenance service system.
Figure 9:
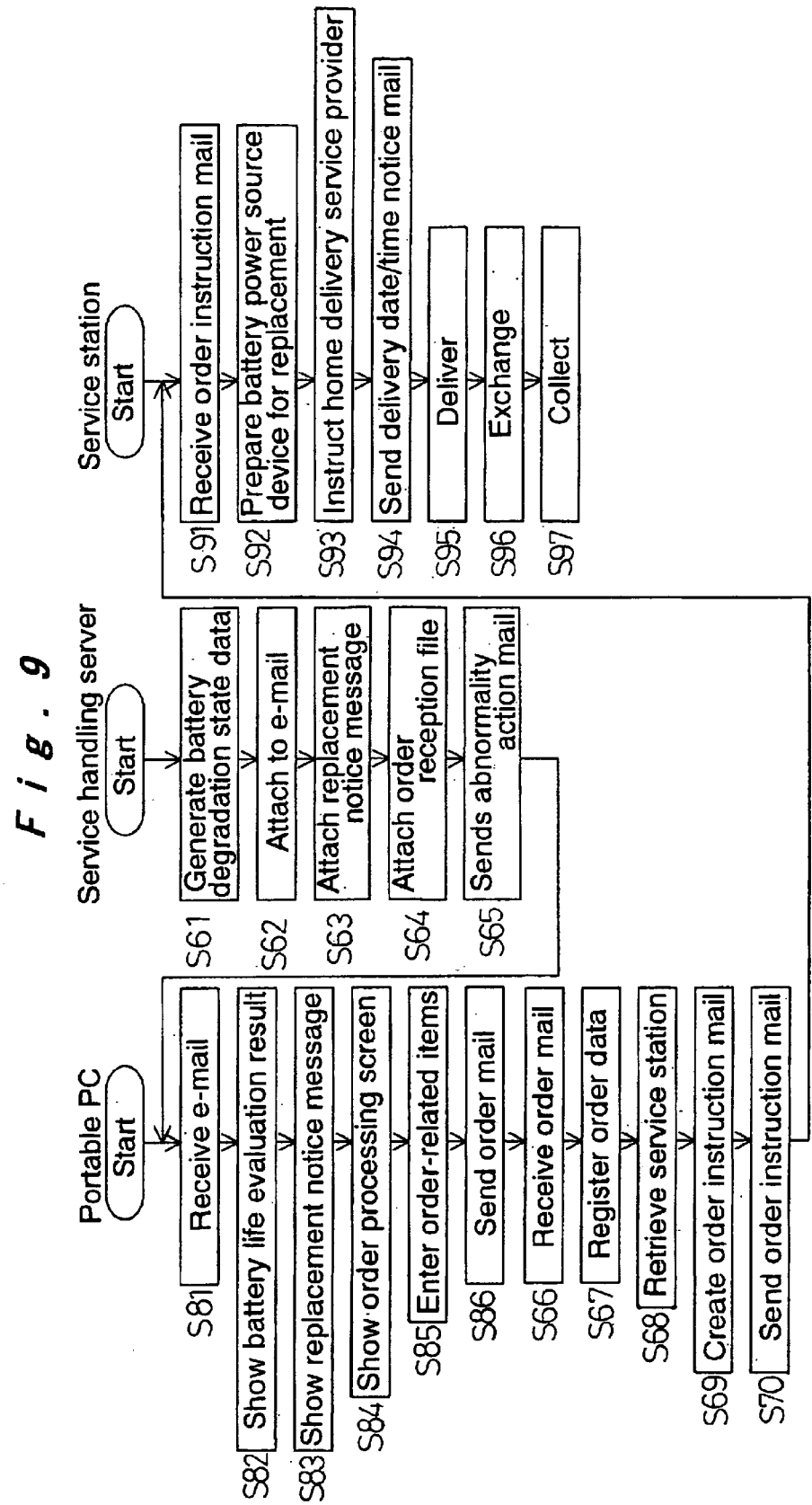
FIG. 9 is a flowchart showing a procedure in case of detecting an abnormality.

The following section describes replacement service processing using the constitution above while referring to flowcharts shown in FIG. 8 and FIG. 9. S41, S42, . . . in the flowcharts are step numbers for indicating a processing procedure, and match numbers described in the following section.

In FIG. 8, the portable PC 2 uses the resident software to start the WWW browser 16 at a predetermined time, and connects with the service handling server 101 (S41). Page information on the maintenance service is transmitted (S42), a set user ID and the identification information are transmitted (S43), and the battery management information is transmitted (S44). The access to the service handling server 101 may not be automated by the resident software as described above, and the user may make access by his operation.

When the service handling server 101 receives the connection from the portable PC 2 (S51), the WWW server/CGI 17 receives the page information, and this makes the information processor 18 start, and a maintenance page opens as a result (S52). The user ID authentication part 30 refers the provided user ID to the mail address DB 23 for identifying the model type of the portable PC 2 used by the user, and identifies the model type of the battery power source device 3 based on the identification information (S53). The information processor 18 uses the parameter analyzer 31 to process the provided battery management information, and creates evaluation object data (S54). The power source information retrieving part 32 retrieves corresponding evaluation object data in a database for the identified model type in the power source information DB 22 (S55), and the evaluation part 33 evaluates the battery management information (S56).

As a result of the evaluation from the evaluation part 33 which determines the necessity of replacing the battery power source device 3 (S57), if it is determined that the replacement is not necessary, the reply data generator 34 generates a reply message indicating "Normal" (S58). The WWW server/CGI 17 transmits the message to the portable PC 2, and when the message is received (S45), if the reply message indicates the normal state (S46), a display "Normal" is shown on the display of the portable PC 2 (S47). On the other hand, if it is determined as "Replacement is necessary" in determining the necessity of the replacement in Step S57, the abnormality data generator 35 generates a reply message (S59), and it is transmitted to the portable PC 2. As a result, a display "Abnormal" appears on the display of the portable PC 2, and simultaneously a notice indicating that information for managing the abnormality will be provided by an e-mail is displayed (S48).

If it is determined as "Replacement is necessary" in the determination for the necessity of the replacement, a subroutine for replacement and collection is executed. In FIG. 9, the abnormality data generator 35 generates battery degradation state data (S61) in the service handling server 101. The e-mail generator 36 retrieves a mail address of the user in the mail address DB 23, generates an e-mail to the user, while attaching the battery degradation state data (S62), a replacement notice message (S63), and an order reception file (S64). Then, the e-mail generator 36 sends them as an action mail (S65).

Figure 10:
FIG. 10 is a screen shot showing a display example of a battery life evaluation result.

When the user receives the action mail through the mailer 25 (S81), and opens it, a battery life evaluation result screen for showing the battery degradation state data appears on the display of the portable PC 2 (S82) as shown in FIG. 10. If the user wants to replace the battery power source device 3 based on the determination on the degradation state, the user clicks "To replacement notice screen" button on the battery life evaluation result screen, a replacement notice message appears (S83) as shown in FIG. 11. Then, the user clicks "To order screen" button after checking the price and the individual displayed items, and an order processing screen appears (S84) as shown in FIG. 12. When the user enters order-related items into individual entries on the order processing screen (S85), and clicks "Order" button, an order mail is sent from the mailer 25 to the mail server 121 (S86).

When the mail server 121 receives the order mail, the server 121 opens it, and forwards it to the service handling server 101 (S66). An order processor 37 registers the order data (S67), retrieves a service station 40 corresponding to the user from the mail address DB 23 (S68), and creates an order instruction mail to the service station 40 (S69). The order instruction mail is uploaded to the mail serve 21, and is sent to the service station 40 (S70).

When the service station 40 receives the order instruction mail (S91), the service station 40 prepares the battery power source device 3 for replacement described in the order instruction mail (S92), transmits delivery data to a home delivery service provider 41 (S93), and simultaneously sends a delivery date/time notice mail to the user (S94). The home delivery service provider 41 receives the battery power source device 3 from the service station 40, delivers it to the user (S95), exchanges the old battery power source device with the new battery power source device (S96), and delivers the old battery power source device to the service station 40 to collect the used battery (S97).

Cash on delivery where the home delivery service provider 41 collects the payment on delivery, and card payment using a credit card are available for the payment settlement of the battery power source device 3.

While the section above describes a case where the Internet is used, the maintenance service for the portable PC 2 may be provided by receiving and sending information via e-mails.

Figure 13:
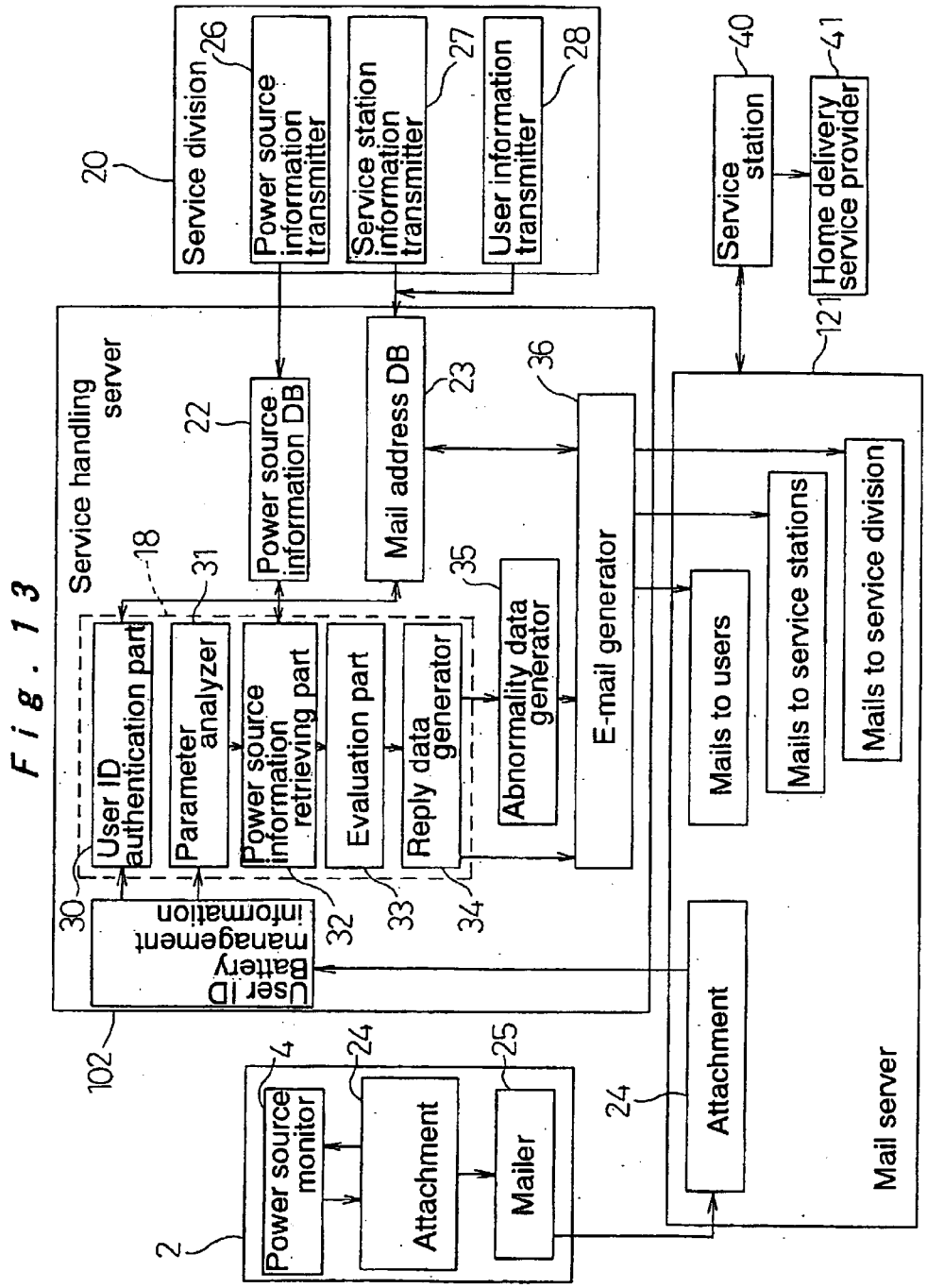
FIG. 13 is a block diagram showing a constitution in a case where an e-mail is used for transmitting data.

The portable PC 2 creates the user ID and the power source information as an attachment 24 to an e-mail, and uses the mailer 25 to transmit it to the mail server 121 via the Internet as shown in FIG. 13. When receiving the attachment 24, the mail server 121 opens it for forwarding it to the service handling server 102. When the service handling server 102 receives the battery management information and the user ID, it processes the information as described above. Because this system is the same as the previously described system excepting that the portable PC 2 sends data as an e-mail, the description for the system is omitted.

While the description above is provided for a case where the electronic device serving as the client is the portable PC 2 provided with the Internet connection function, when the PC does not have the Internet connection function such as a modem, it is also obviously possible to connect with the Internet by inserting a modem PC card or the like into a PC card slot, or using a cellular phone or a PHS phone. A PDA (personal digital assistant) which can access to the Internet can serve as the client device in the same way.

In addition to the portable PC 2, a mobile communication device such as a cellular phone or a PHS phone having a connection function with a communication network may serve as the client device, and the service handling server 102 can provide the maintenance service for power source devices for them. When the battery management means 7 is provided for the battery power source device of the mobile communication device for detecting battery management information of it, and the operation state data are transmitted to the service handling server 102 through data communication service of the mobile communication device, the maintenance service is provided as described above. For the mobile communication device, the service handling server may be installed in a base station for the mobile communication device.

The following section describes a third embodiment of the present invention. Constitution elements common to the constitution elements in the first and second embodiments are assigned with the same numerals.

The third embodiment is a maintenance service system where an electric-powered vehicle which uses a rechargeable battery as a traveling power source such as an electric vehicle and a hybrid vehicle is a client device, a service handling server is set up on the Internet (a communication network) corresponding to the vehicle, an Internet connection function provided for the electric-powered vehicle is used to make access to the service handling server, and a maintenance service is given to a battery power source device provided for the electric-powered vehicle.

Figure 14:
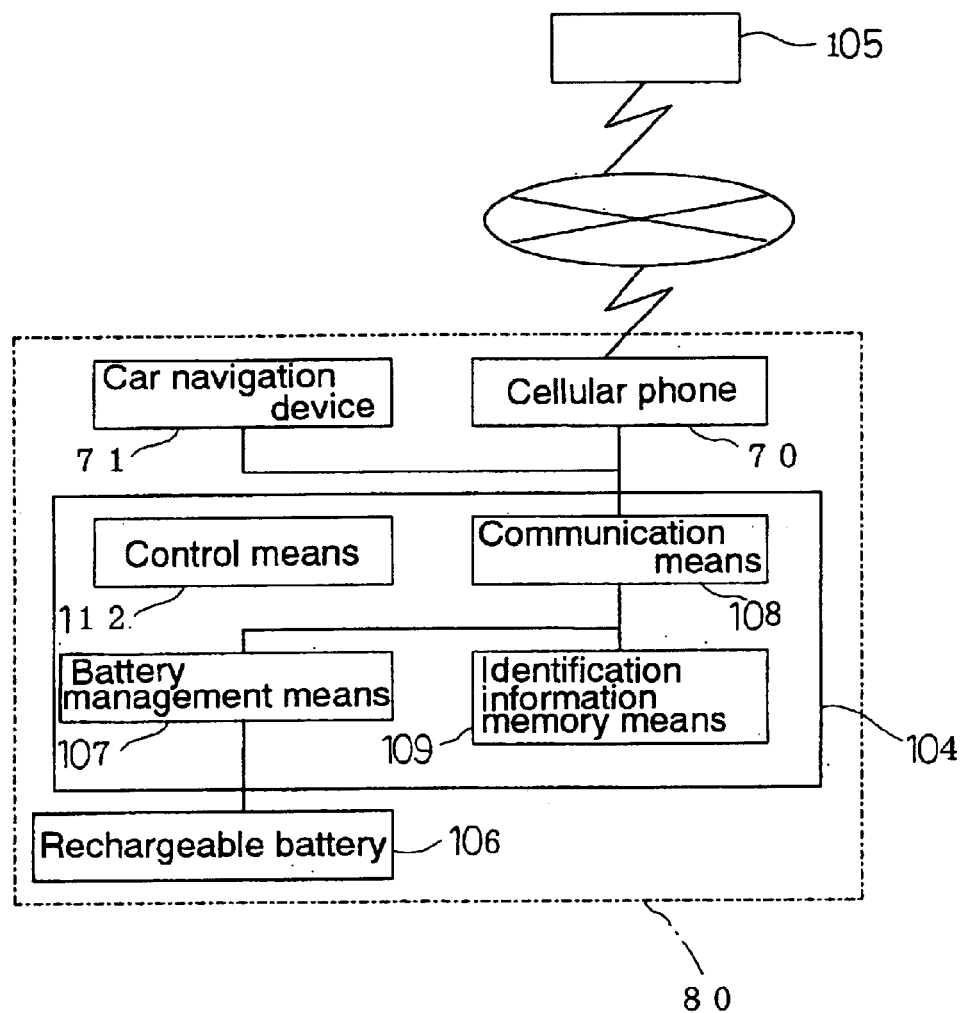
FIG. 14 is a block diagram showing a constitution for a maintenance service for an electric vehicle according to a third embodiment of the invention.

As shown in FIG. 14, an electric-powered vehicle 80 has a power source monitor 104 provided with battery management means 107 for detecting the battery voltage, the battery temperature, the charging and discharging cycle, and the like of a rechargeable battery 106, identification information memory means 109 for storing identification information for identifying a user ID and the vehicle type of the electric-powered vehicle, communication means 108 as an interface for communicating with a cellular phone 70 and a car navigation device 71, and control means 112 for controlling a maintenance operation for the rechargeable battery 106. A control operation of the control means 112 transmits battery management information extracted from the battery management means 107, and the identification information and the user ID extracted from the identification information memory means 109 from the communication means 108 to the cellular phone 70, and the cellular phone 70 transmits them to the service handling server 105.

Figure 15:
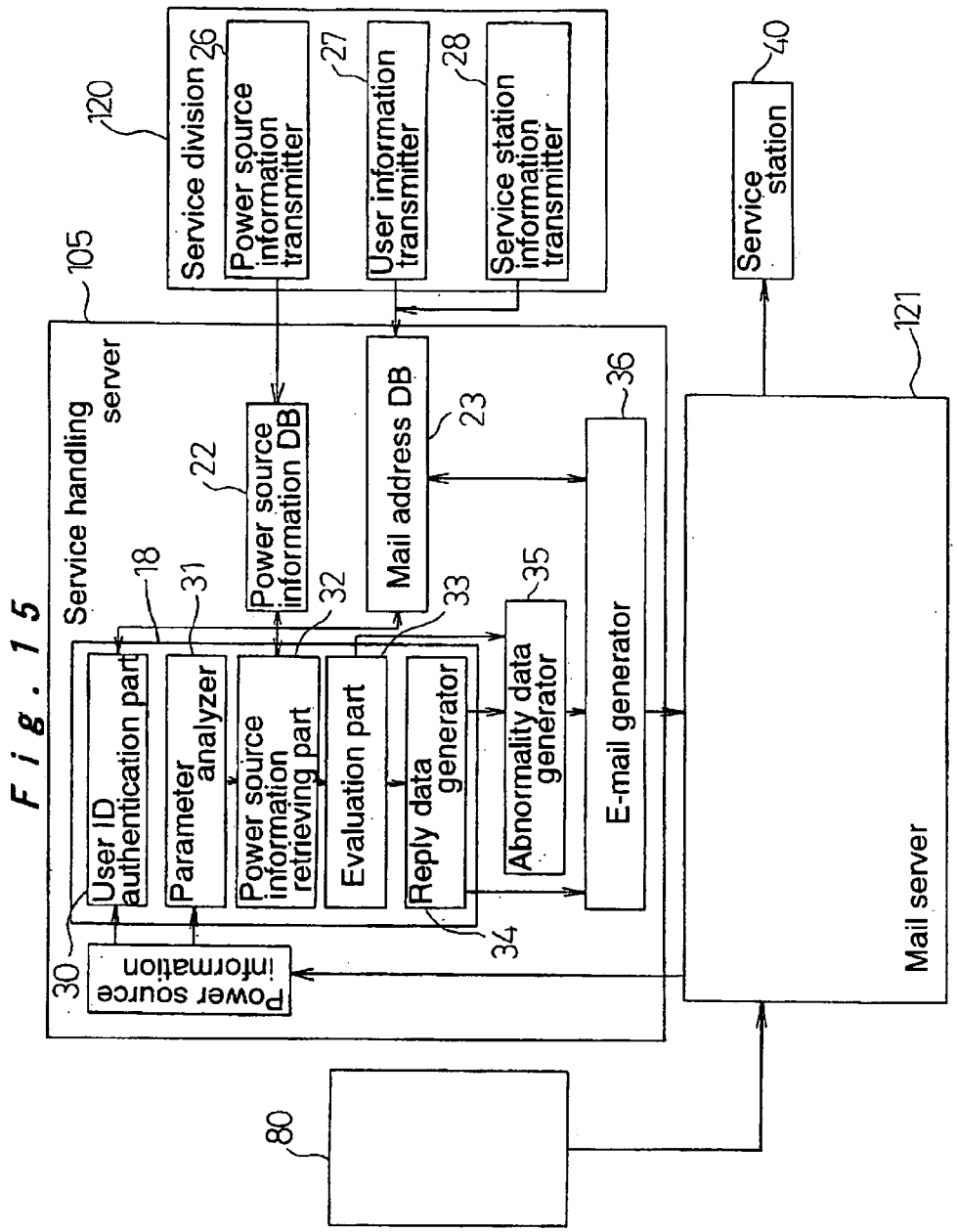
FIG. 15 is a block diagram showing a constitution of the maintenance service system.

As shown in FIG. 15, the service handling server 105 processes the information transmitted from the electric-powered vehicle 80, and returns reply information. The power source information DB (Database) 22 provided for the service handling server 105 stores the latest data transmitted from the power source information transmitter 26 of a service division 120. When a user purchases the electric-powered vehicle 80, the user is registered. Then, registration data are stored from the user information transmitter 27 in the service division 120 into the mail address DB 23 in the service handling server 105. Service stations are set up at individual locations for providing a maintenance service in case of detecting an abnormality, and information from the service stations is also stored from the base station information transmitter 28 in the service division 120 into the mail address DB 23.

Figure 16:
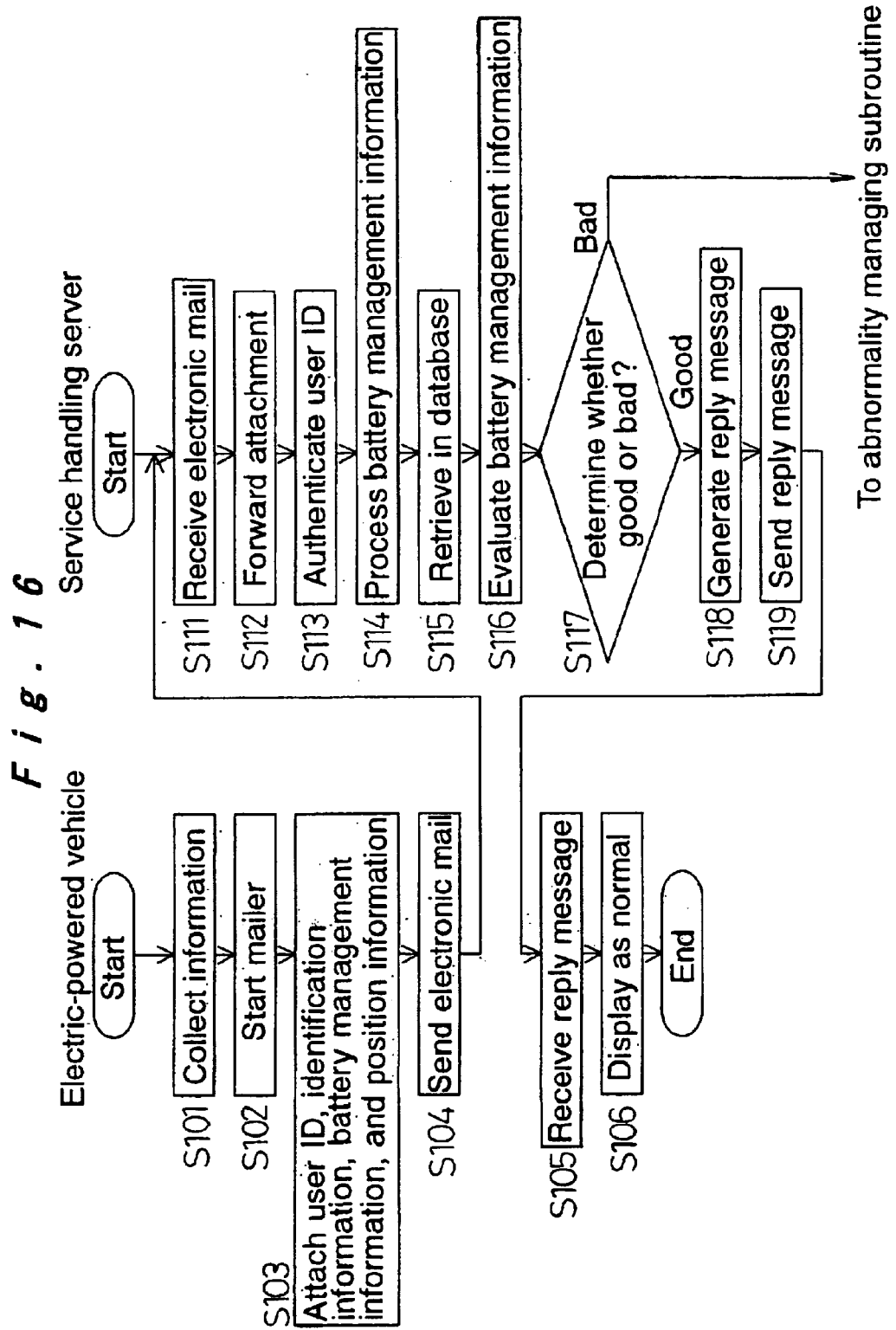
FIG. 16 is a flowchart showing a procedure of the maintenance service system.

The following section describes maintenance service processing provided from the constitution above while referring to the flowcharts shown in FIG. 16 and FIG. 17. S101, S102, . . . in the flowcharts are step numbers for indicating a processing procedure, and match numbers described in the following section.

In FIG. 16, the electric-powered vehicle 80 uses resident software to start constitution elements at each predetermined time, or detects a user operation to start them. Then, the battery management information is extracted from the battery management means 107, and the identification information and the user ID are acquired from the identification information memory means 109. Further, present position information is acquired from the car navigation device 71 (S101), a mailer is started (S102), and the information is attached as an attachment to an electronic mail (S103), and sent as an electronic mail from the cellular phone 70 to the service handling server 105 (S104).

When the mail server 121 receives the electronic mail (S111), the server 121 opens the attachment, and forwards it to the service handling server 105 (S112). The service handling server 105 uses the user ID authentication part 30 to refer the entered user ID to the mail address DB 23 for user authentication, and simultaneously identifies the vehicle type of the electric-powered vehicle 80 based on the identification information (S113). The parameter analyzer 31 is used to process the battery management information for creating evaluation subject data (S114), the power source information retrieving part 32 retrieves evaluation subject data in a database for the identified vehicle type in the power source information DB 22 (S115), and the evaluation part 33 evaluates the battery management information (S116). This evaluation determines whether the rechargeable battery 106 is good or bad (S117).

If it is determined as normal, the reply data generator 34 generates a reply message indicating the normal state (S118), attaches it to an electronic mail, and sends it from the mail server 121 to the electric-powered vehicle 80 (S119).

When the electric-powered vehicle 80 receives the reply message indicating the normal state (S105), a display "Normal" appears on a display of the car navigation device 71 (S106). On the other hand, if it is determined as "Abnormal", an abnormality managing subroutine shown in FIG. 17 is executed.

In FIG. 17, when it is determined as abnormal, the abnormality data generator 35 generates abnormality data (S121), the mail address DB 23 retrieves a service station 40 corresponding to the position information (S122), and a data file for guiding to the corresponding service station 40 is created. The abnormality data and the service station data file are attached along with a battery replacement prompting message for prompting replacing the rechargeable battery 106 (S123) to an abnormality action mail created by the e-mail generator 36 (S124), and the mail is uploaded to the mail server 21 to be sent to the electric-powered vehicle 80 (S125). The sent abnormality action data are registered and saved (S126).

When the electric-powered vehicle 80 receives the abnormality action mail, the abnormality data appear on the display of the car navigation device 71 (S141), and simultaneously the battery replacement prompting message appears as shown in FIG. 18 (S142). The position information on the corresponding service station 40 written into the service station data file is read into the car navigation device 71, and the position appears on the display (S143). If the user wants to replace the battery based on the determination on the abnormality data, the user sends an order mail included in the battery replacement prompting message to the service handling server 105 (S144), and drives the electric-powered vehicle 80 to the service station 40 shown on the display of the car navigation device 71.

When the service handling server 105 receives the order mail from the electric-powered vehicle 80 (S127), it refers to the registered abnormality action data, creates an electronic mail with attached data required for replacing the battery addressed to the corresponding service station 40, and uploads it to the mail server 121 to send it to the service station 40 (S128). When the service station 40 receives this electronic mail (S131), it prepares a rechargeable battery 106 for replacement (S132). When the electric-powered vehicle 80 arrives (S133), the battery is replaced(S134), and the used rechargeable battery 106 is collected (S135).

Figure 19:
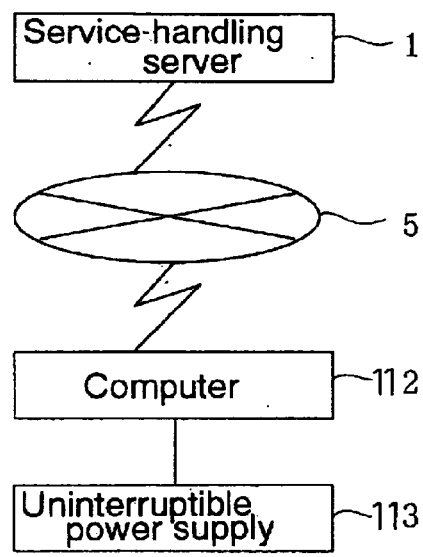
FIG. 19 is a block diagram showing a constitution of a maintenance service system for an uninterruptible power supply according to a fourth embodiment of the invention.

The following section describes a fourth embodiment of the invention. As shown in FIG. 19, the fourth embodiment is a maintenance service system where a maker of uninterruptible power supplies (battery power source devices) 113 sets up a service handling server 1 on the Internet (a communication network) 5 corresponding to computers 112 which serve as client devices, and are connected with different model types of the uninterruptible power supplies 113, the computer 112 uses a provided Internet connection function to make access to the service handling server 1, and maintenance service for the uninterruptible power supply 113 is provided.

Figure 20:
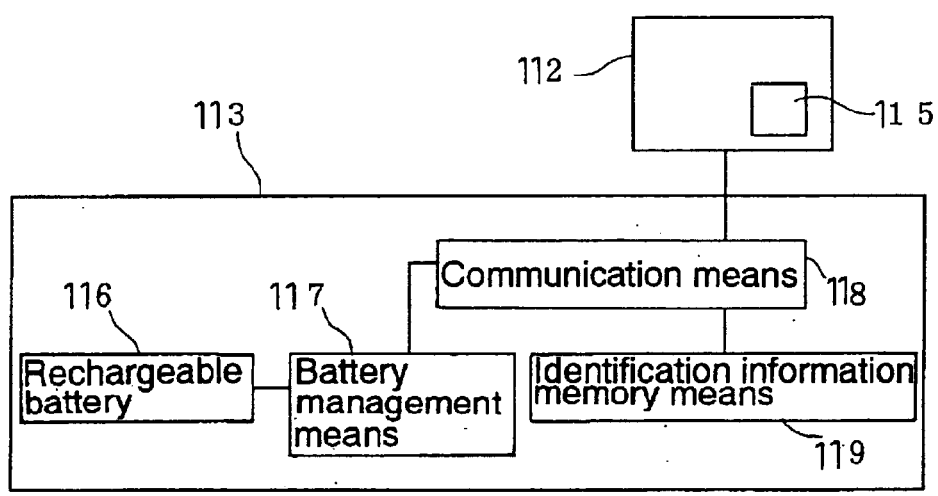
FIG. 20 is a block diagram showing a principal part constitution of the uninterruptible power supply.

As shown in FIG. 20, the uninterruptible power supply 113 includes a rechargeable battery 116, battery management means 117 for detecting the battery voltage, the charging and discharging currents, the battery temperature, the remaining capacity and the like of the rechargeable battery 116, and monitoring the operation state of it, identification information memory means 119 for storing identification information for identifying the model type, and communication means 118 for forming an information communication channel to the computer 112.

The uninterruptible power supply 113 is connected with an AC power source circuit of the computer 112, and operates either as a normally commercial power supplying system where a commercial power is directly supplied for the computer 112 in a normal state, and the DC power of the rechargeable battery 116 is transformed into an AC power for supplying in case of a power source trouble such as an interruption, or as a normally inverter supplying system where the commercial power is used to charge the rechargeable battery 116, and simultaneously an AC power obtained from a DC/AC inversion is supplied. The communication means 118 connects the communication channel to a serial port or a USB port of the computer 112.

The computer 112 is provided with Internet connection means 115 such as a modem, and resident software for maintenance service starts a WWW browser 16 at a predetermined time interval to make an access to the service handling server 1. The computer 112 transmits battery management information obtained from the battery management means 117, and the identification information obtained from the identification information memory means 119 via the communication means 118 to the service handling server 1.

Figure 21:
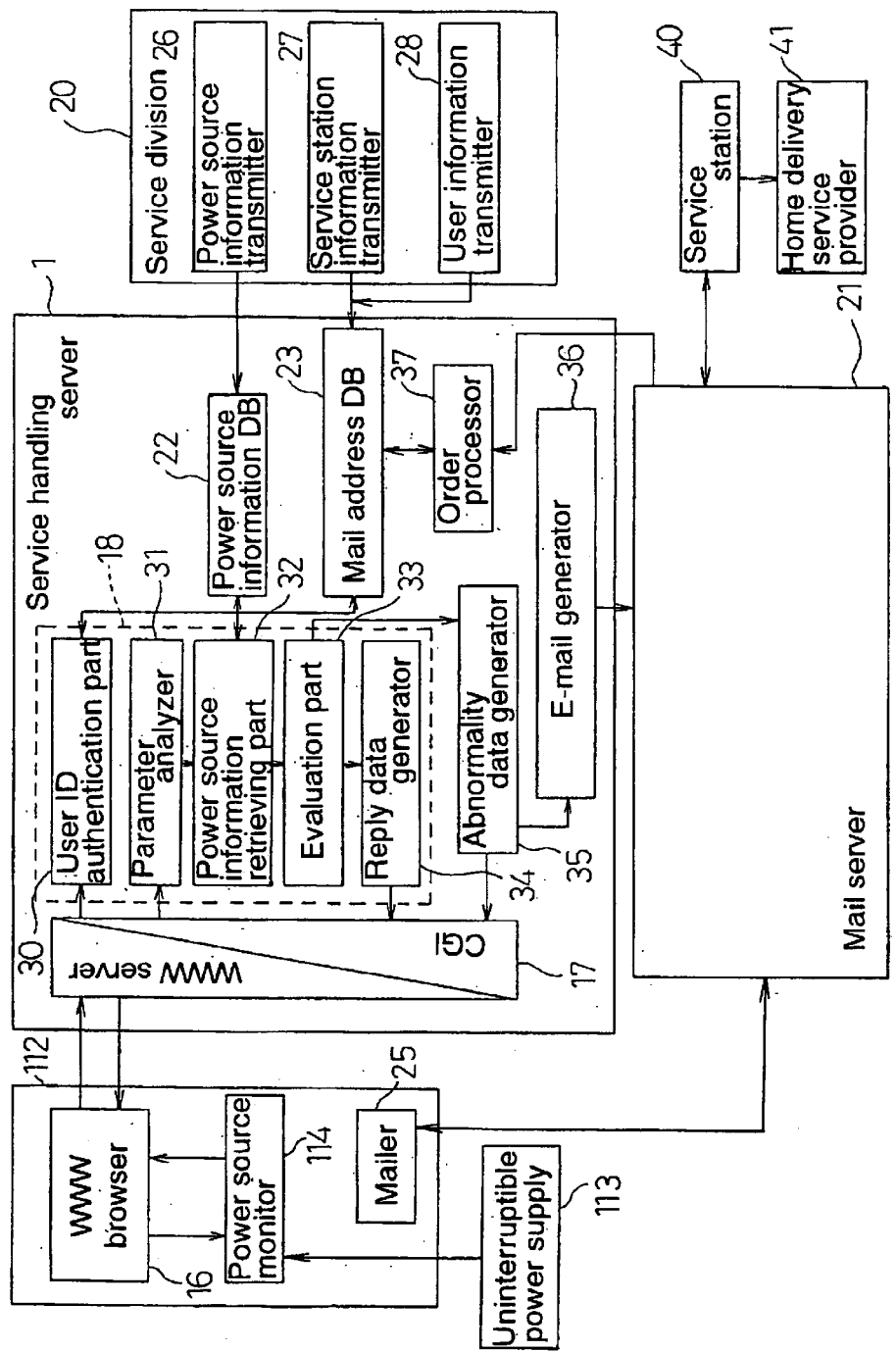
FIG. 21 is a block diagram showing a constitution of the maintenance service system.

On the other hand, the service handling server 1 processes information transmitted from the computer 112, and returns reply information as shown in FIG. 21. The power source information DB (Database) 22 provided for the service handling server 1 stores the latest data transmitted from the power source information transmitter 26 of the service division 120. When a user purchases the uninterruptible power source 113, the user is registered. Then, registration data at this time are stored from the user information transmitter 28 of the service division 20 into the mail address DB 23 in the service handling server 1. The service stations 40 are setup in individual areas for providing a maintenance service when an abnormality is detected, and information on the service stations 40 is also stored from the service station information transmitter 27 of the service division 20 into the mail address DB 23. It is preferable to set up the service stations 40 at such places as retailers and support centers of the computers 112.

The WWW server/CGI 17 functions as an interface with the computer 112 serving as a client, receives information transmitted from the computer 112, and forwards a result of information processing as reply data to the computer 112. The information processor 18 conducts the information processing, and when an abnormality is detected, the mail server 21 transmits action information on the abnormality as e-mails (electronic mails) to individual locations.

Figure 22:
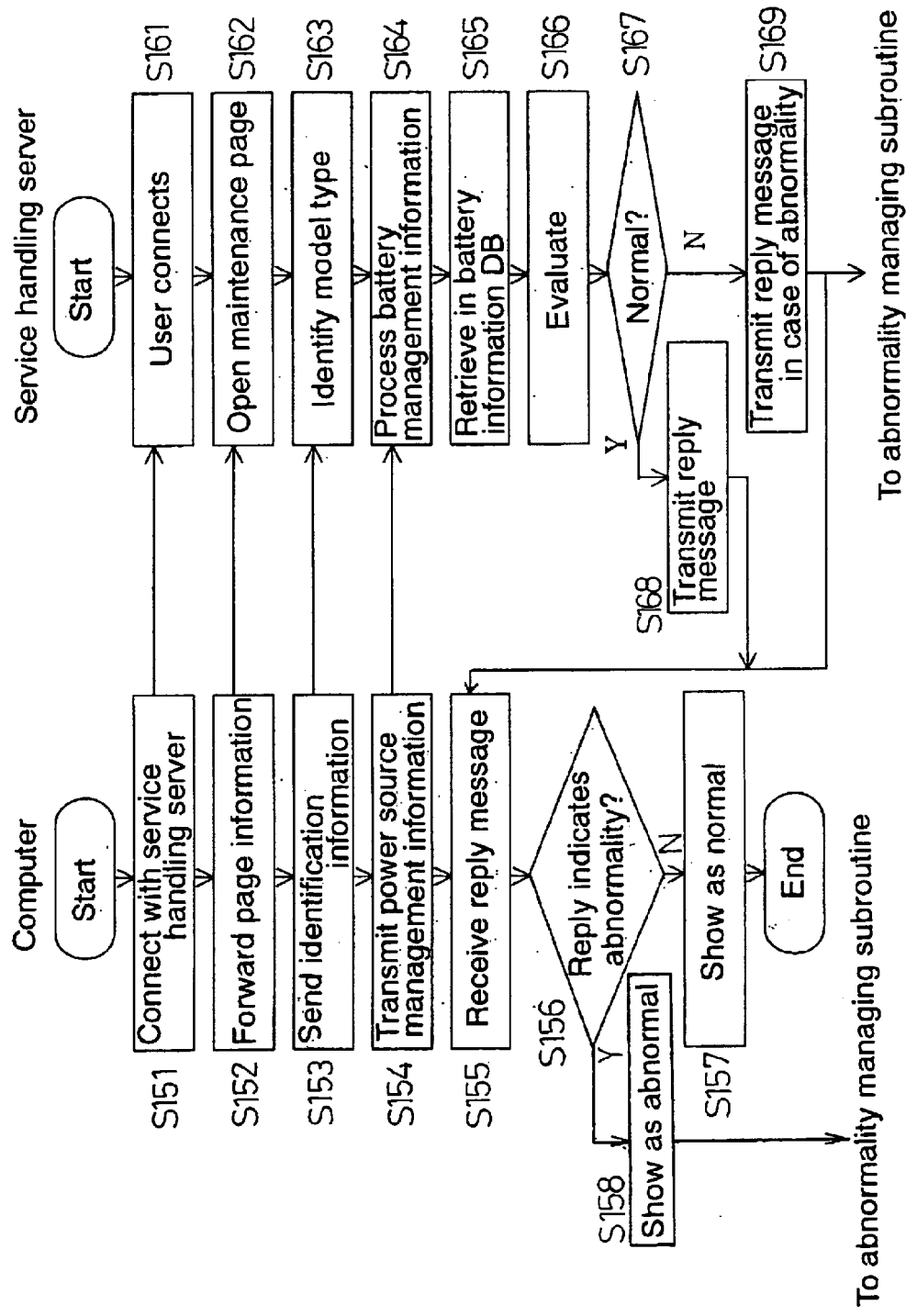
FIG. 22 is a flowchart showing a procedure of the maintenance service system.
Figure 23:
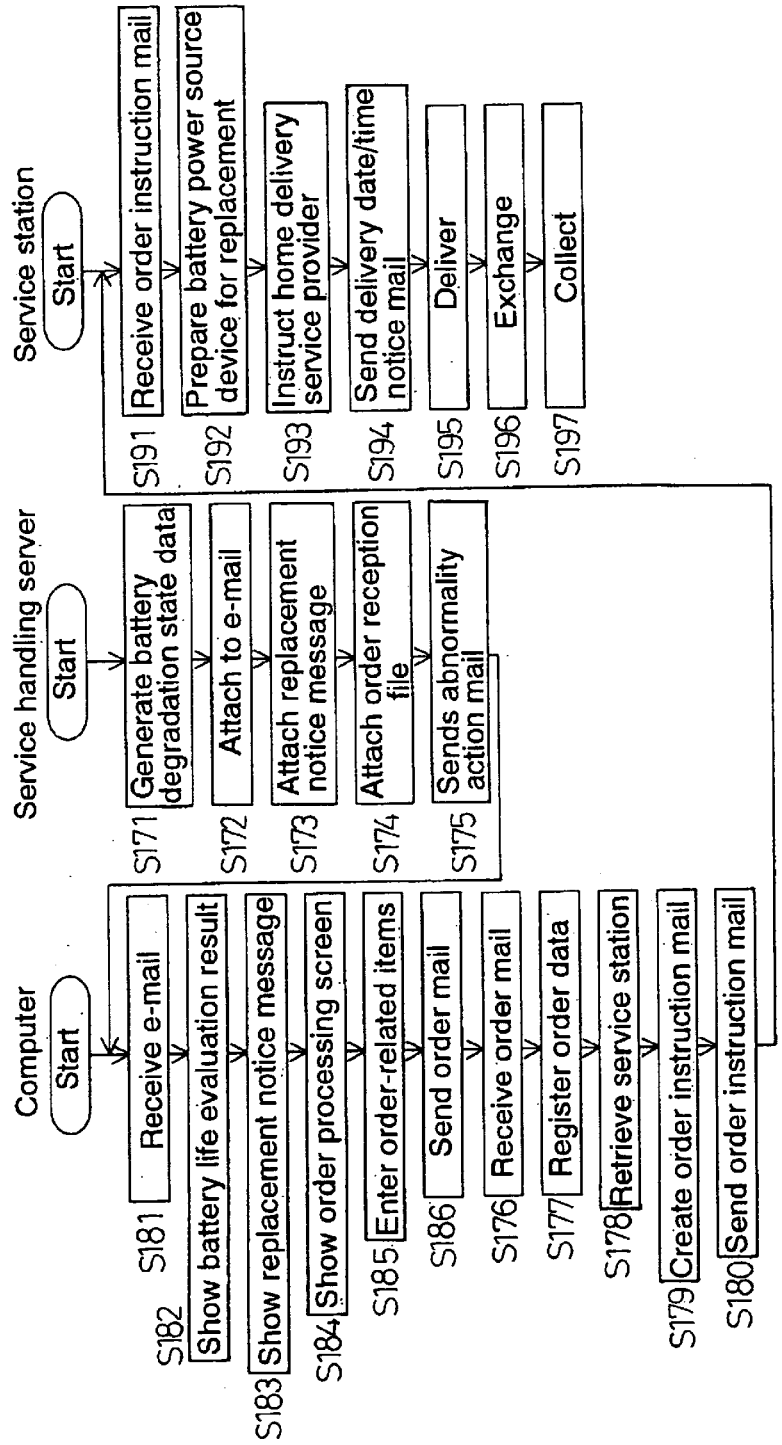
FIG. 23 is a flowchart showing a procedure for replacing a battery.

The following section describes maintenance service processing using the constitution above while referring to flowcharts in FIG. 22 and FIG. 23. S151, S152, . . . in the flowcharts are step numbers for indicating a processing procedure, and match numbers described in the following section.

In FIG. 22, the computer 112 uses the resident software to start the WWW browser 16 at a predetermined time, and connects with the service handling server 1 (S151). Then, page information on the maintenance service is transmitted (S152), the set identification information is transmitted (S153), and the battery management information is transmitted (S154). The access to the service handling server 1 may not be automated by the resident software as described above, and the user may make access by his operation.

When the service handling server 1 receives the connection from the user (S161), the WWW server/CGI 17 receives the page information, and this makes the information processor 18 start to open a maintenance page opens (S162). Then, the user ID authentication part 30 refers the provided identification information to the mail address DB 23, and identifies the model type of the uninterruptible power supply 113 used by the user (S163). The information processor 18 uses the parameter analyzer 31 to process data of the provided battery management information, and creates evaluation object data (S164). The power source information retrieving part 32 retrieves corresponding evaluation object data in a database corresponding to the model type in the power source information DB 22 (S165), and the evaluation part 33 evaluates the battery management information (S166). Namely, since the power source information DB 22 stores normal values of the battery management information, if the evaluation object data do not match in a predetermined range, it is determined as abnormal, and if they match, it is determined as normal (S167).

If the evaluation part 33 determines as normal, the reply data generator 34 generates a reply message indicating "Normal" (S168), and the WWW server/CGI 17 transmits the message to the computer 112. When the computer 112 receives the message (S155), if the message is "Normal" (S156), a display "Normal" is shown on a display (S157). On the other hand, if it is determined as "Abnormal", the abnormality data generator 35 generates a reply message, and it is transmitted to the computer 112 (S169). Then, an abnormality managing subroutine shown in FIG. 23 is executed. The reply message in case of abnormality appears as "Abnormal" on the display of the computer 112, and simultaneously a notice indicating that information for handling the abnormality will be provided by an e-mail is displayed (S168).

If an abnormality of the battery power source device 113, namely a degradation of the rechargeable battery 116, is detected, a processing operation for replacing and collecting the rechargeable battery 116 shown in FIG. 23 is executed in the service handling server 1 as an abnormality managing subroutine. The abnormality data generator 35 generates battery degradation state data in the service handling server 1 (S171) in FIG. 23. The e-mail generator 36 retrieves a mail address of the user in the mail address DB 23, creates an e-mail to the user, and attaches the battery degradation state data (S172), a replacement notice message (S173), and an order reception file (S174) to the e-mail. Then, the mail server 21 sends them as an abnormality action mail (S175).

When the computer 112 receives the abnormality action mail through the provided mailer 25 (S181), and opens it, the battery life evaluation result screen for showing the battery degradation state data appears on the display of the computer 112 (S182) as shown in FIG. 10. If the user wants to replace the rechargeable battery 116 based on the determination on the degradation state, the user clicks "To replacement notice screen" button in the battery life evaluation result screen, a replacement notice message is shown (S183) as in FIG. 11. Then, the user clicks "To order screen" button after checking the price, the part name, and the like, and an order processing screen appears (S184) as shown in FIG. 12. When the user enters order-related items into individual entries on the order processing screen (S185), and clicks "Order" button, an order mail is sent from the mailer 25 to the mail server 21 (S186).

When the mail server 21 receives the order mail, the server 21 opens it, and forwards it to the service handling server 1 (S176). The order processor 37 registers the order data (S177), retrieves a service station 40 corresponding to the address of the user from the mail address DB 23 (S178), and creates an order instruction mail to the service station 40 (S179). The order instruction mail is uploaded to the mail serve 21, and is sent to the service station 40 (S180).

When the service station 40 receives the order instruction mail (S191), the service station 40 prepares the rechargeable battery 6 for replacement described in the order instruction mail (S192), transmits delivery data to the home delivery service provider 41 (S193), and simultaneously sends a delivery date/time notice mail to the computer 112 (S194). The home delivery service provider 41 receives the rechargeable battery 6 from the service station 40, delivers it to the user (S195), and exchanges the used rechargeable battery with the replacement rechargeable battery (S196). Then, the provider 41 delivers the used rechargeable battery to the service station 40, and consequently the used rechargeable battery is collected (S197).

Cash on delivery where the home delivery service provider 41 collects the payment on delivery, and card payment using a credit card are available for the payment of the rechargeable battery 116.

Figure 24:
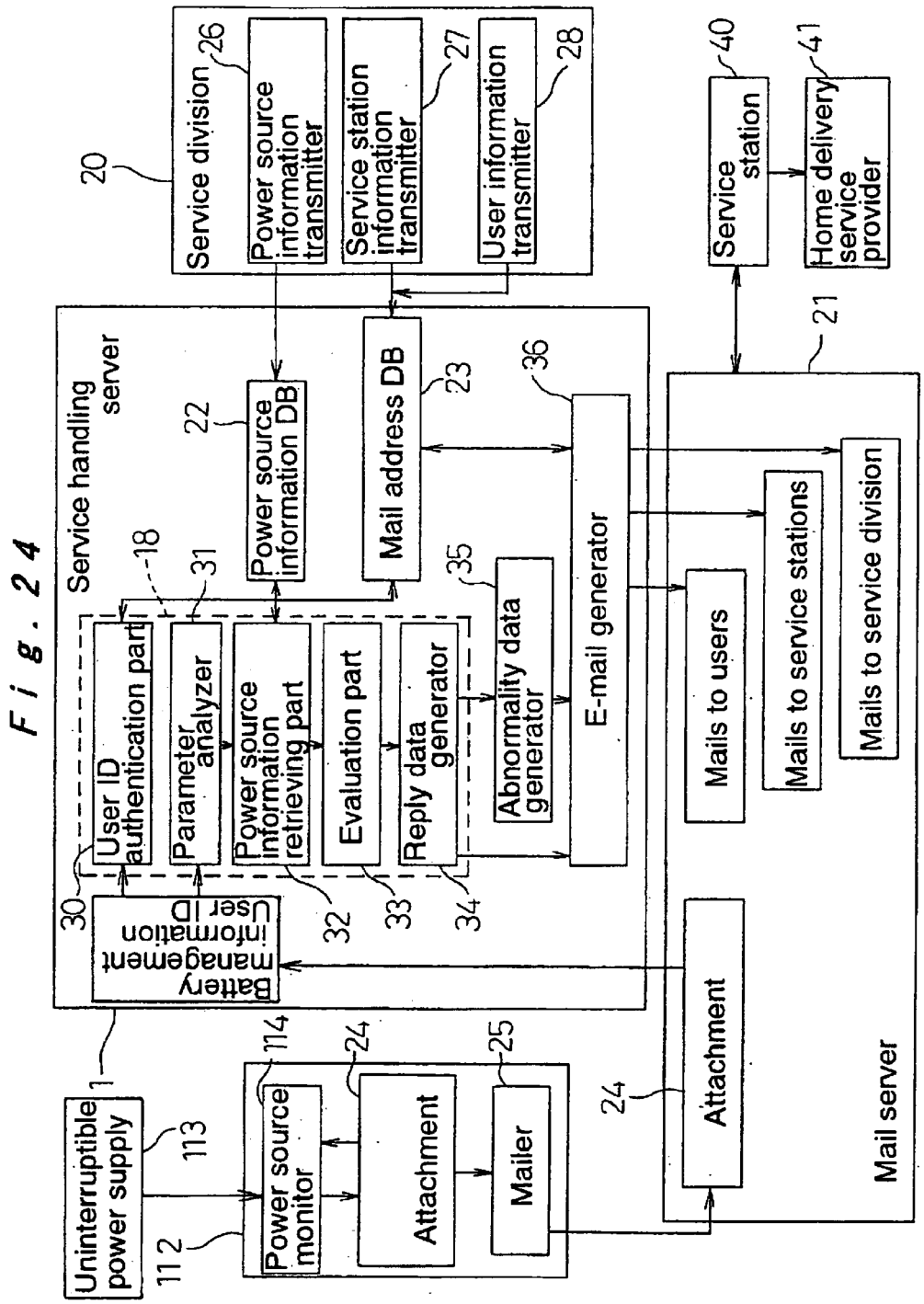
FIG. 24 is a block diagram showing the maintenance service system using an e-mail.

While the section above describes a case where the Internet is used, the maintenance service for the uninterruptible power source 113 may be provided by receiving and sending information via e-mails. As shown in FIG. 24, the computer 112 creates the battery management information and the identification information obtained from the battery management means 117 and the identification information memory means 119 of the uninterruptible power supply 113 through the communication means 118 as an attachment 24 to an e-mail, and uses the mailer 25 to transmit it to the mail server 121 through the Internet. When the mail server 21 receives the attachment 24, the mail server 21 opens it for forwarding it to the service handling server 1. When the service handling server 1 receives the battery management information and the identification information, it processes the information as described above, and transmits an answer mail indicating "Normal" to the computer 112 if there is no abnormality. Because this system is the same as the previously described system excepting that the computer 112 sends data as an e-mail, the description for the system is omitted.

While the previous section describes an example of an application to the uninterruptible power supply 113, there is a handset of a cordless telephone as an example of a device which is provided with a battery power source device, and is connected with a device having a connection function with a communication network. The maintenance service for a battery power source device may be applied thereto.

Figure 25:
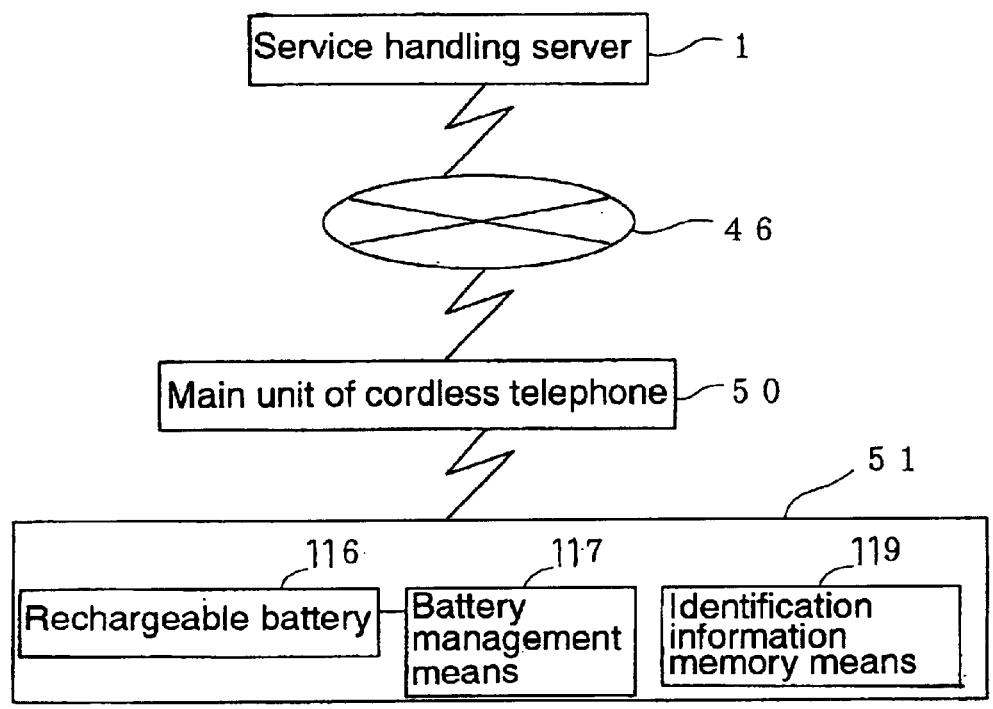
FIG. 25 is a block diagram showing a constitution for applying the maintenance service system to a handset of a cordless telephone.

As shown in FIG. 25, the service handling server 1 is set up on a communication network 46 via the ISDN (Integrated Services Digital Network), and the main unit 50 of the cordless telephone is connected thereto. The battery management means 117 for monitoring the operation state of the rechargeable battery 116 serving as an operation power source, and the identification information memory means 119 for storing identification information for identifying the model types of the handset 51 and the rechargeable battery 116 are provided for the handset 51 of the cordless telephone. Because communication channel through weak radio wave is formed between the hand set 51 and the main unit 50, the main unit 50 uses communication to the handset 51 to extract the battery management information from the battery management means 117, and the identification information from the identification information memory means 119, and sends them to the service handling server 1. When the service handling server 1 receives the battery management information and the identification information, the server 1 processes the information as described before, and sends answer information to the main unit 50. Then, the answer information appears on a display of the main unit 50.

When the cordless telephone is provided with an electronic mail function, the battery management information and the identification information is sent as an attachment to an e-mail, and maintenance for the rechargeable battery 116 is provided as in the system described before.

Figure 26:
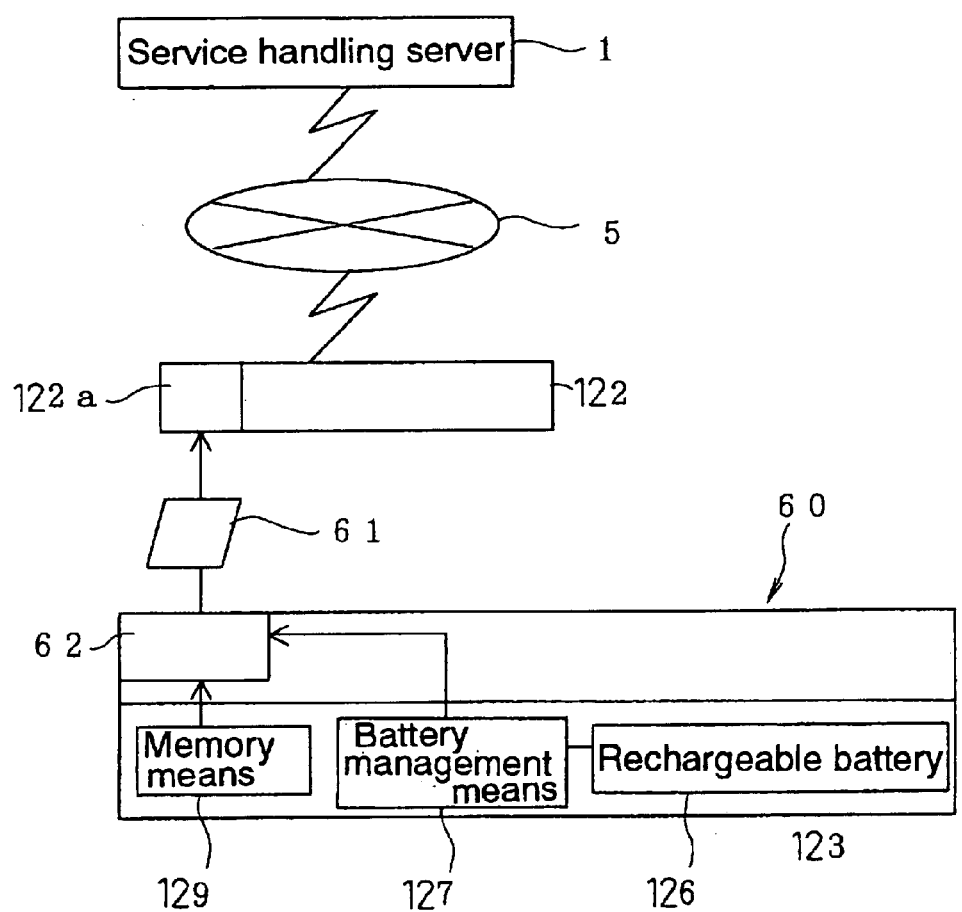
FIG. 26 is a block diagram showing a basic constitution of a maintenance service system for a battery power source device according to a fifth embodiment of the invention.

The following section describes a fifth embodiment of the invention. The fifth embodiment is a maintenance service system where the service handling server 1 is set up on the Internet (a communication network) 5 for maintenance service, and a battery power source device 123 used by a digital camera 60 is maintained through a computer 122 as shown in FIG. 26.

The digital camera 60 operates on the battery power source device 123 as a power source provided with a rechargeable battery 126, battery management means 127 for detecting the battery voltage, the charging and discharging currents, the battery temperature, the remaining capacity and the like of the rechargeable battery 126, and managing the operation state thereof, and identification information memory means 129 for storing identification information for identifying the model type. The camera 60 uses a read/write device 62 for writing an imaged picture into a memory medium 61 to record battery management information detected by the battery management means 127, and the identification information read out from the identification information memory means 129 into the memory medium 61. This recording is conducted at an arbitrary timing, and the timing may be specified by a user, or may be at a predetermined interval.

When the memory medium 61 storing the battery management information and the identification information along with images is connected with a read/write device 122a of the computer 122, the computer 122 obtains the battery management information and the identification information. The computer 122 is provided with Internet connection means such as a modem. A WWW browser 16 starts when the memory medium 61 is connected with the read/write device 122a, and the computer 122 accesses to the service handling server 1 to transmit the battery management information and the identification information to the service handling server 1.

Figure 27:
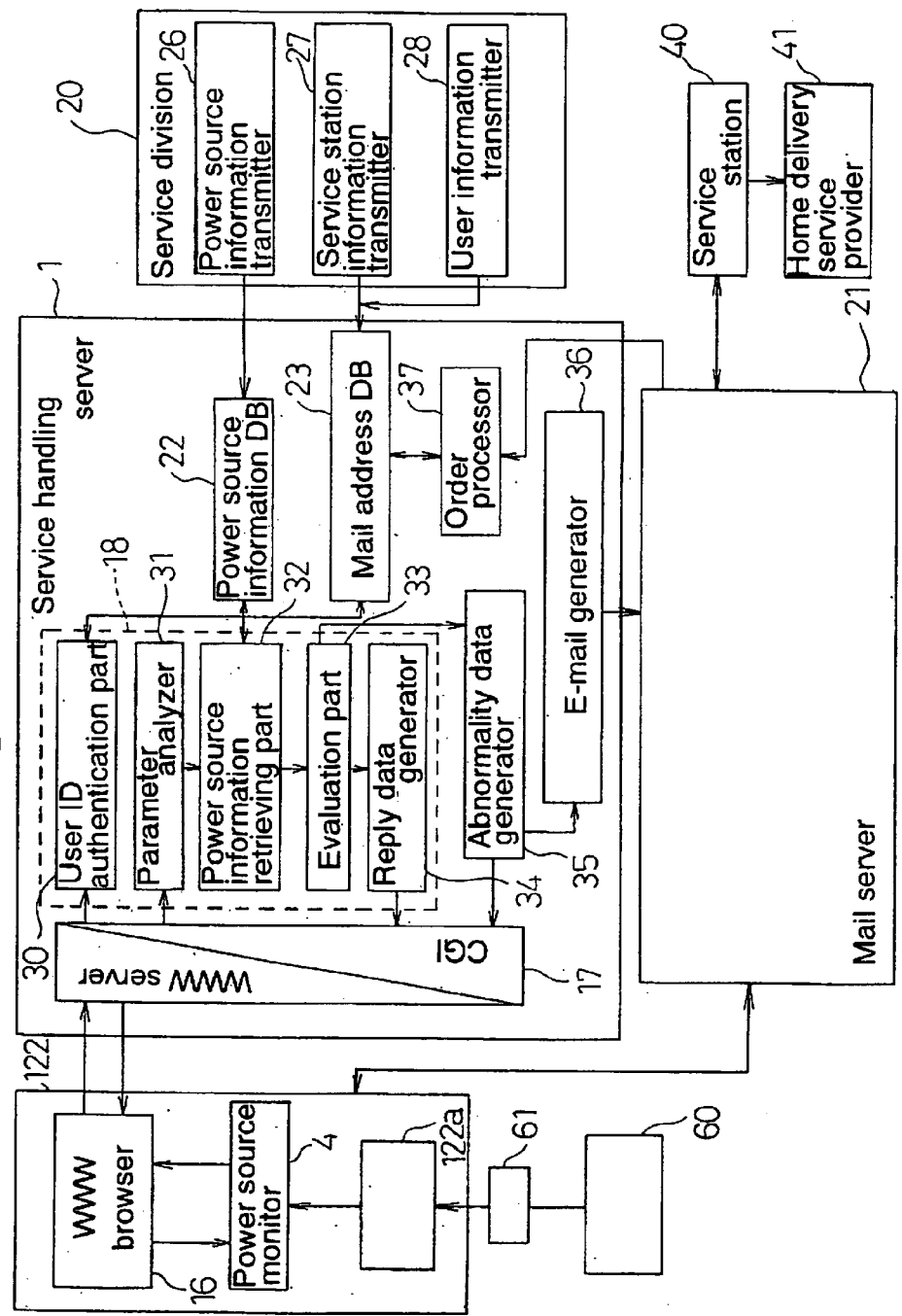
FIG. 27 is a block diagram showing a constitution of the maintenance service system.

On the other hand, the service handling server 1 processes the information transmitted from the computer 122, and returns reply information as shown in FIG. 27. The power source information DB (Database) 22 provided for the service handling server 1 stores the latest data transmitted from the power source information transmitter 26 of the service division 20. The service stations 40 are setup in individual areas for providing a maintenance service when an abnormality is detected. Information on the service stations 40 is also stored from the service station information transmitter 27 of the service division 20 into the mail address DB 23. It is preferable to set up the service stations 40 at such places as retailers and support centers of the computers 122.

The WWW server/CGI 17 functions as an interface with the computer 122 serving as a client, receives information transmitted from the computer 122, and forwards a result of information processing as reply data to the computer 122. The information processor 18 conducts the information processing, and when an abnormality is detected, the mail server 21 transmits action information on the abnormality as e-mails (electronic mails) to individual locations.

Figure 28:
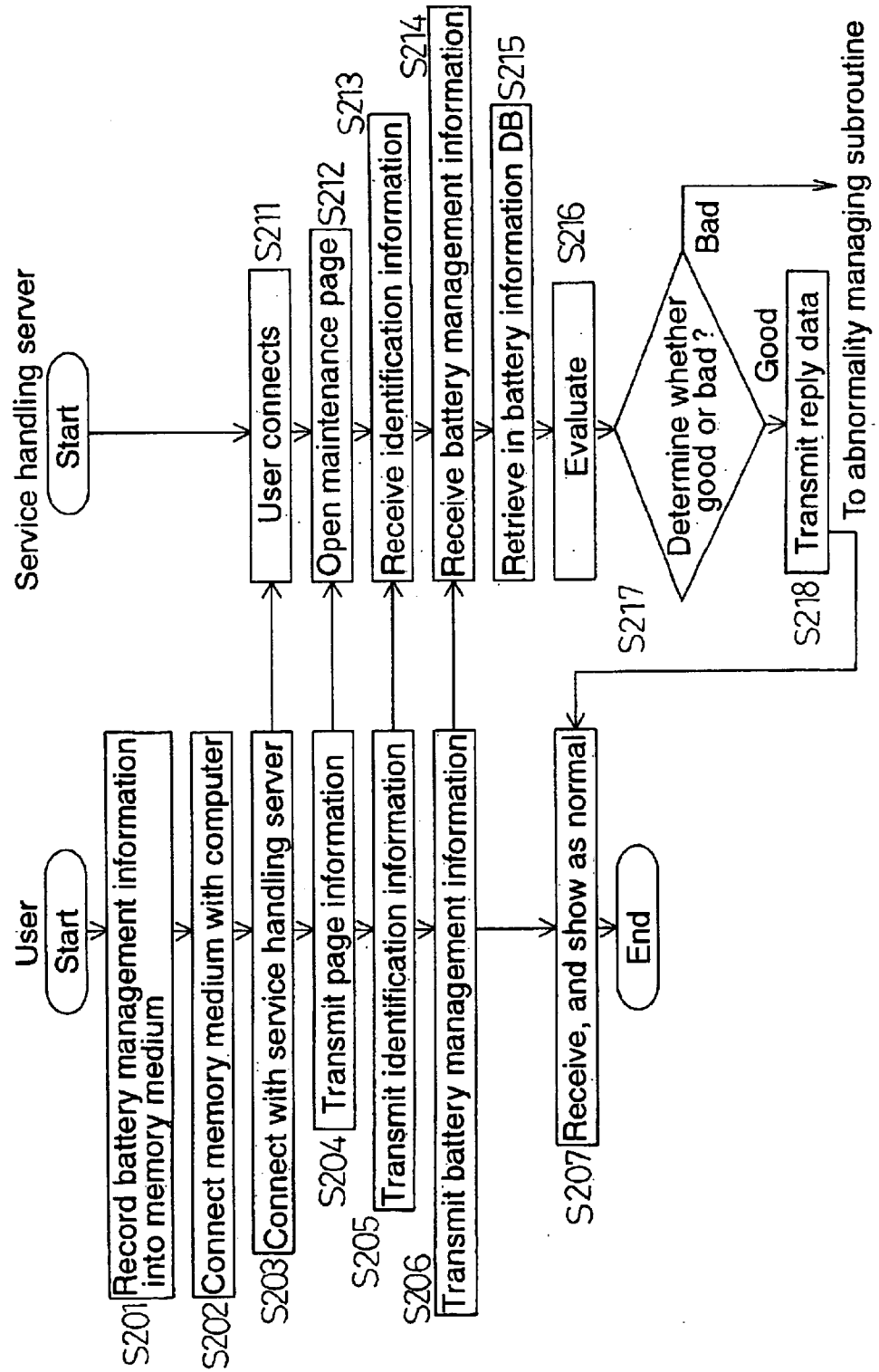
FIG. 28 is a flowchart showing a procedure of the maintenance service system.
Figure 29:
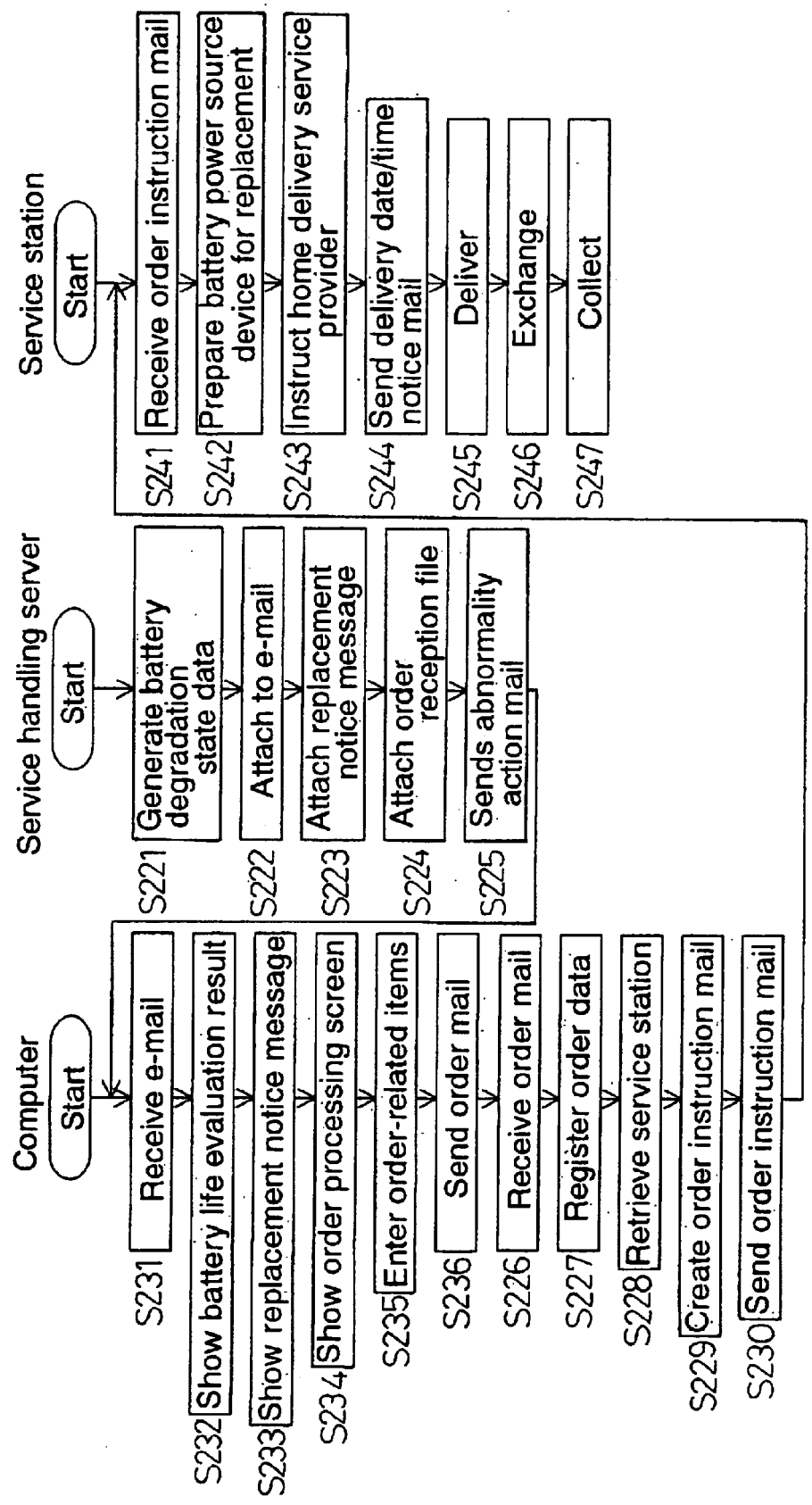
FIG. 29 is a flowchart showing a procedure for replacing a battery.

The following section describes maintenance service processing using the constitution above while referring to flowcharts in FIG. 28 and FIG. 29. S201, S202, . . . in the flowcharts are step numbers for indicating a processing procedure, and match numbers described in the following section.

In FIG. 28, a user records the battery management information and the identification information into the memory medium 61 of the digital camera 60 (S201), and connects the memory medium 61 with the read/write device 122a of the computer 122 (S202). The computer 122 with which the memory medium 61 is connected starts the WWW browser 16, and connects with the service handling server 1 (S203). Then, page information on the maintenance service is transmitted (S204), the set identification information is transmitted (S205), and the battery management information is transmitted (S206).

When the service handling server 1 receives the connection from the user (S211), the WWW server/CGI 17 receives the page information, and this makes the information processor 18 start to open a maintenance page as a result (S212). Then, the user ID authentication part 30 refers the provided identification information to the mail address DB 23, and identifies the model type of the battery power source device 3 used by the user (S213). When the battery management information is received (S214), the parameter analyzer 31 processes the data to create evaluation object data. The power source information retrieving part 32 retrieves in a database corresponding to the identified model type in the power source information DB 22 (S215), the evaluation object data are evaluated (S216). Reply data as "Normal" are generated and are transmitted to the computer 122 if the result of determining whether good or bad in the evaluation (S217) is normal. Then, a display as "Normal" appears on a display when the computer 122 receives them (S207). On the other hand, if it is determined as "Abnormal", the abnormality data generator 35 generates a reply message, and it is transmitted to the computer 122. Then, an abnormality managing subroutine shown in FIG. 29 is executed. The reply message in case of the abnormality appears as "Abnormal" on the display of the computer 122, and simultaneously a notice indicating that information for managing the abnormality will be provided by an e-mail is displayed.

If an abnormality of the battery power source device 123, namely a degradation of the rechargeable battery 126, is detected, a processing operation for replacing and collecting the rechargeable battery 126 shown in FIG. 29 is executed in the service handling server 1 as an abnormality managing subroutine. In FIG. 29, the abnormality data generator 35 generates battery degradation state data (S221) in the service handling server 1. The e-mail generator 36 retrieves a mail address of the user in the mail address DB 23, creates an e-mail to the user. Thereafter, the generator 36 attaches the battery degradation state data (S222), a replacement notice message (S223), and an order reception file (S224) to the e-mail, and the mail server 21 sends it as an abnormality action mail (S225).

When the computer 122 receives the abnormality action mail (S231), and opens it, the battery life evaluation result screen for showing the battery degradation state data appears on the display of the computer 122 (S232) as shown in FIG. 10. If the user wants to replace the rechargeable battery 126 based on the determination on the degradation state, the user clicks "To replacement notice screen" button in the battery life evaluation result screen, a replacement notice message appears (S233) as shown in FIG. 11. Then, the user clicks "To order screen" button after checking the price, the part name, and the like, and an order processing screen appears (S234) as shown in FIG. 12. When the user enters order-related items into individual entries on the order processing screen (S235), and clicks "Order" button, an order mail is sent from the mailer to the mail server 21 (S236).

When the mail server 21 receives the order mail, the mail server 21 opens the mail, and forwards it to the service handling server 1 (S226). The order processor 37 registers the order data (S227), retrieves a service station 40 corresponding to the address of the user from the mail address DB 23 (S228), and creates an order instruction mail to the service station 40 (S229). The order instruction mail is uploaded to the mail serve 21, and is sent to the service station 40 (S230).

When the service station 40 receives the order instruction mail (S241), the service station 40 prepares the rechargeable battery 126 for replacement described in the order instruction mail (S242), transmits delivery data to the home delivery service provider 41 (S243), and simultaneously transmits a delivery date/time notice mail to the computer 122 (S244). The home delivery service provider 41 receives the rechargeable battery 126 from the service station 40, delivers it to the user (S245), and exchanges the used rechargeable battery with the replacement rechargeable battery (S246). The provider 41 delivers the used rechargeable battery to the service station 40 to collect the used rechargeable battery (S247).

Cash on delivery where the home delivery service provider 41 collects the payment on delivery, and card payment using a credit card are available for the payment of the rechargeable battery 126.

Figure 30:
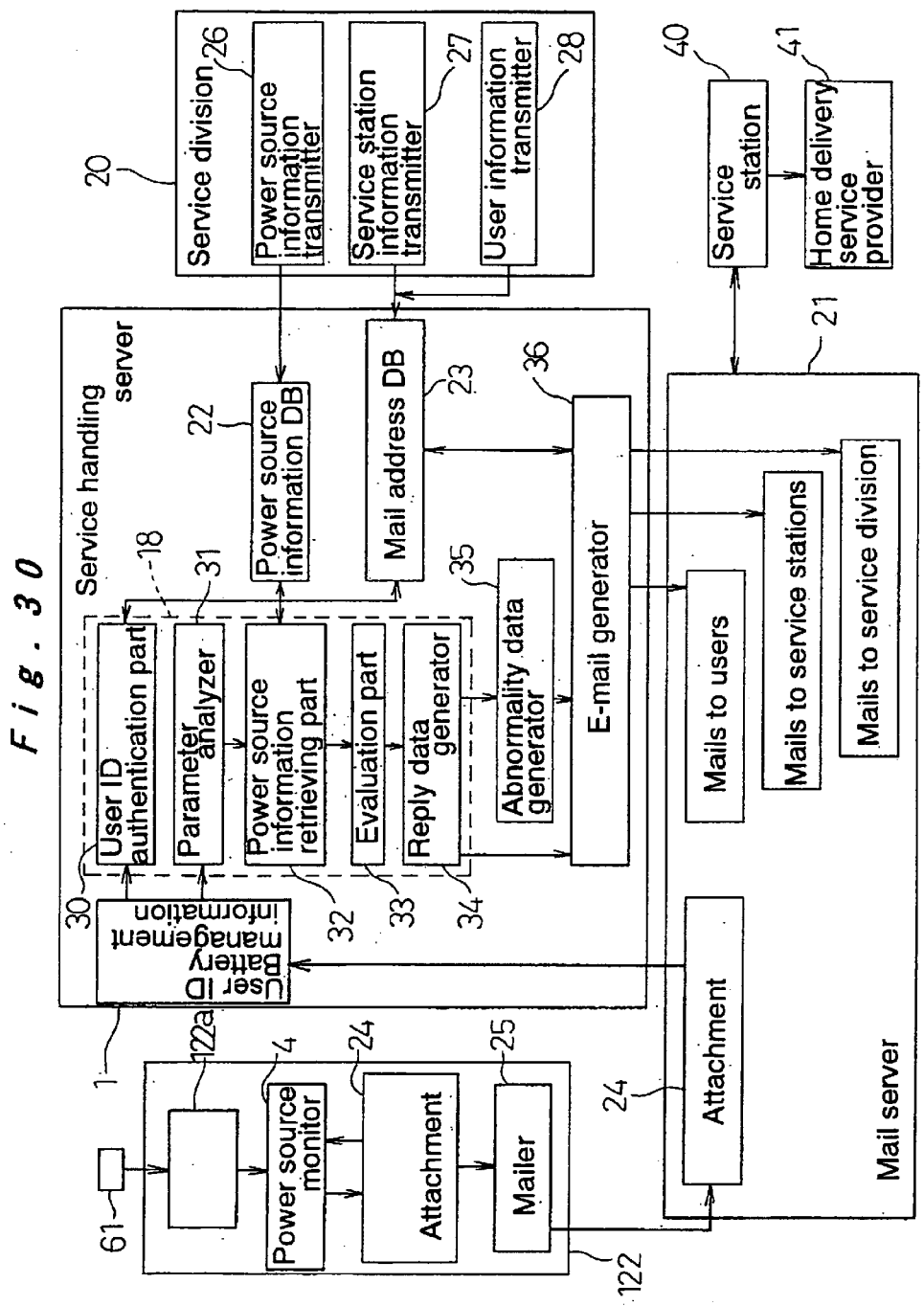
FIG. 30 is a block diagram showing the maintenance service system using an e-mail.

While the section above describes a case where the Internet is used, the maintenance service may be provided by receiving and sending information via e-mails. As shown in FIG. 30, the computer 122 obtains the battery management information and the identification information from the memory medium 61 through the read/write device 122a, creates an attachment 24 to an e-mail from the information, and uses a mailer 25 to transmit it to the mail server 21 via the Internet. When the mail server 21 receives the attachment 24, the mail server 21 opens it for forwarding it to the service handling server 1. When the service handling server 1 receives the battery management information and the identification information, the server 1 processes the information as described above, and transmits an answer mail indicating "Normal" to the computer 122 if there is no abnormality. Because this system is the same as the previously described system excepting that the computer 122 transmits data using an e-mail, the description for the system is omitted.

Figure 31:
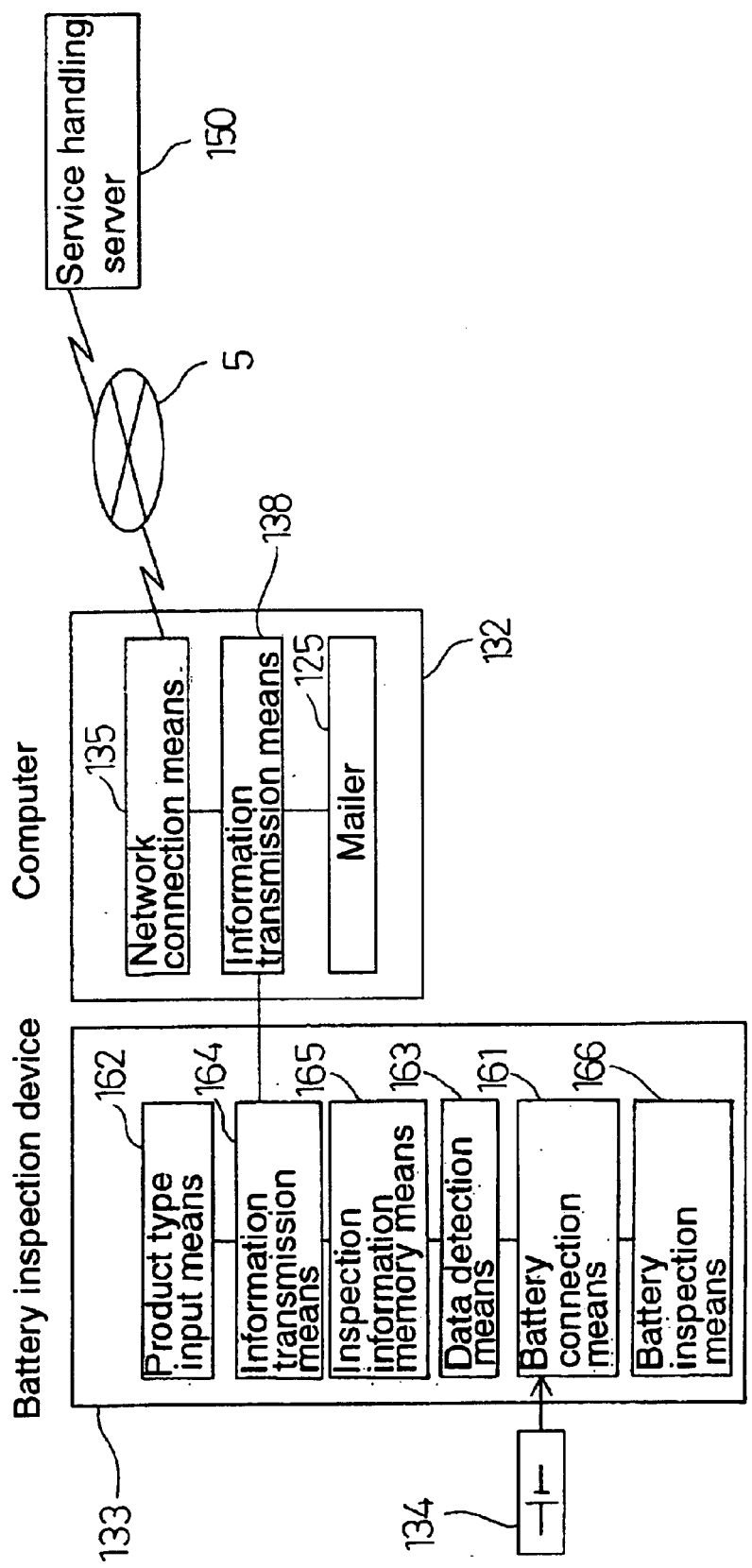
FIG. 31 is a block diagram showing a constitution of a battery inspection system according to a sixth embodiment of the invention.

The following section describes a sixth embodiment of the invention. The sixth embodiment is a maintenance service system for a battery where a computer 132 transmits operation state data of a battery 134 connected with a battery inspection device 133 to the service handling server 150 through the Internet (a communication network) 5 for evaluating the operation state of the battery 134 as shown in FIG. 31. The service handling server 150 is set up on the Internet 5 by a battery maker, for example. The server 150 stores inspection procedure programs corresponding to the product types of the batteries 134, and has a function for evaluating the state of the battery 134 based on the operation state data obtained from an inspection based on the inspection procedure program.

The battery inspection device 133 includes battery connection means 161 for connecting with the battery 134 to be inspected, product type input means 162 for entering a product type number which identifies the product type of the battery 134 connected with the battery connection means 161, inspection information memory means 165 for storing the inspection procedure programs and product type information, battery inspection means 166 for inspecting the battery based on the inspection procedure program, data detection means 163 for detecting operation state data of the battery 134 obtained by the inspections, and information transmission means 164 for serving as an interface with the computer 132. The battery inspection device 133 is connected with the computer 132 through the information transmission means 164. If the product type input means 162 is provided with a barcode reader for reading a barcode for identifying the product type of the battery 134, it is efficient when a barcode is shown on the battery 134.

The computer 132 is provided with network connection means 135 such as a modem, and starts a WWW browser to make access to the service handling server 150. Then, the computer 132 transmits the information obtained from the battery inspection device 133 through the information transmission means 138 to the service handling server 150, and receives information from the service handling server 150 to forward it to the battery inspection device 133.

Figure 32:
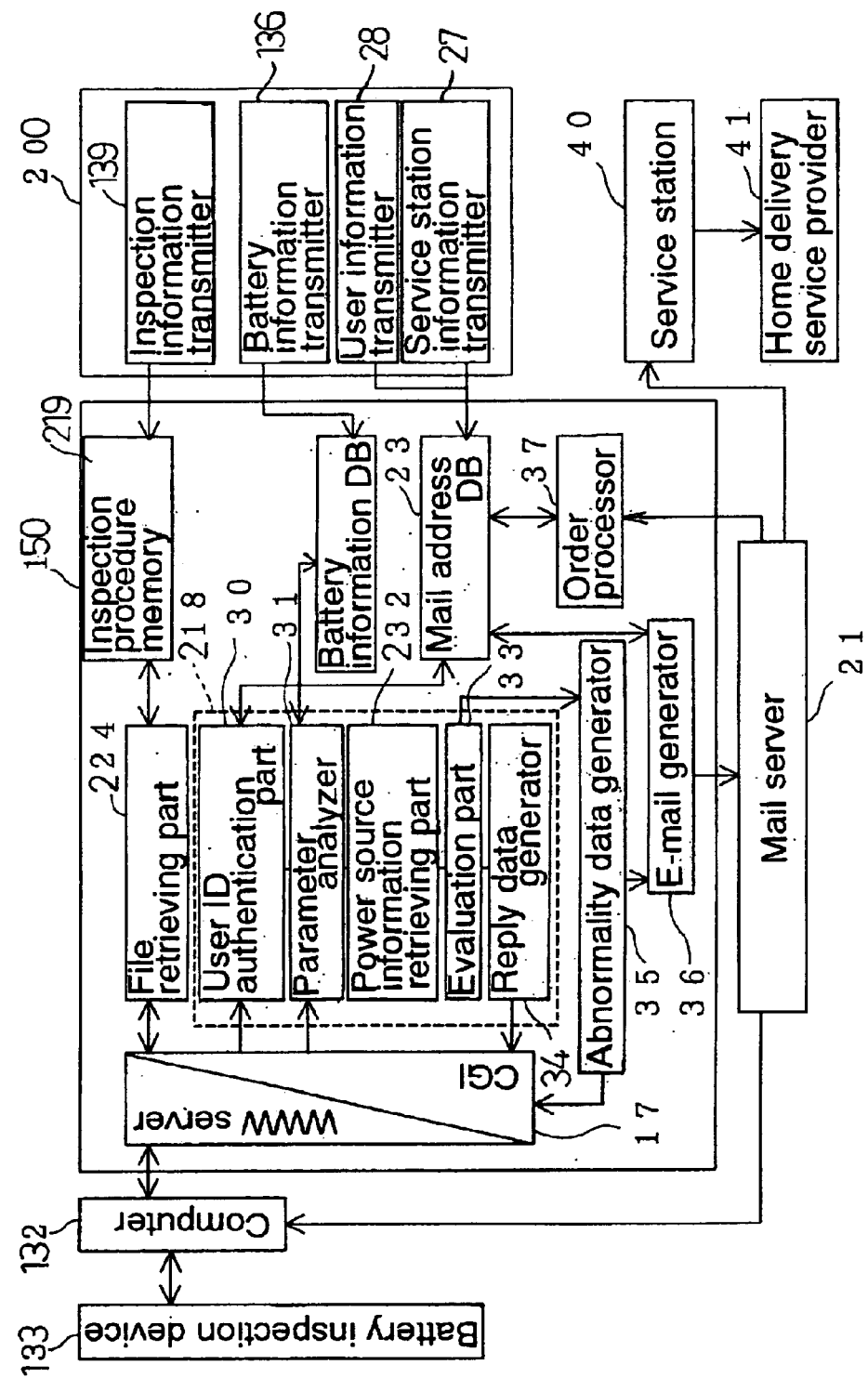
FIG. 32 is a block diagram showing a constitution of a service handling server.

On the other hand, the service handling server 150 processes the information transmitted from the computer 132, and returns information as shown in FIG. 32. A battery information DB (Database) 222 provided for the service handling server 150 stores the latest data indicating a normal operation state of the battery 134 transmitted from a battery information transmitter 136 of a service division 200. An inspection procedure memory (inspection procedure storage means) 219 stores the latest inspection procedure programs transmitted from an inspection information transmitter 139 of the service division 200. When a user purchases the battery inspection device 133, the user is registered. Then, registration data at this time are stored from the user information transmitter 28 of the service division 200 into the mail address DB 23 in the service handling server 150. The service stations 40 are setup in individual areas for providing replacement and collection service when an abnormality is detected, and information on the service stations 40 is also stored from the service station information transmitter 27 of the service division 200 into the mail address DB 23.

The WWW server/CGI 17 functions as an interface with the computer 132 serving as a client, receives information transmitted from the computer 132, and forwards a result of information processing as reply data to the computer 132. An information processor 218 conducts the information processing, and when an abnormality is detected, the mail server 21 transmits action information on the abnormality as e-mails to individual locations.

Figure 33:
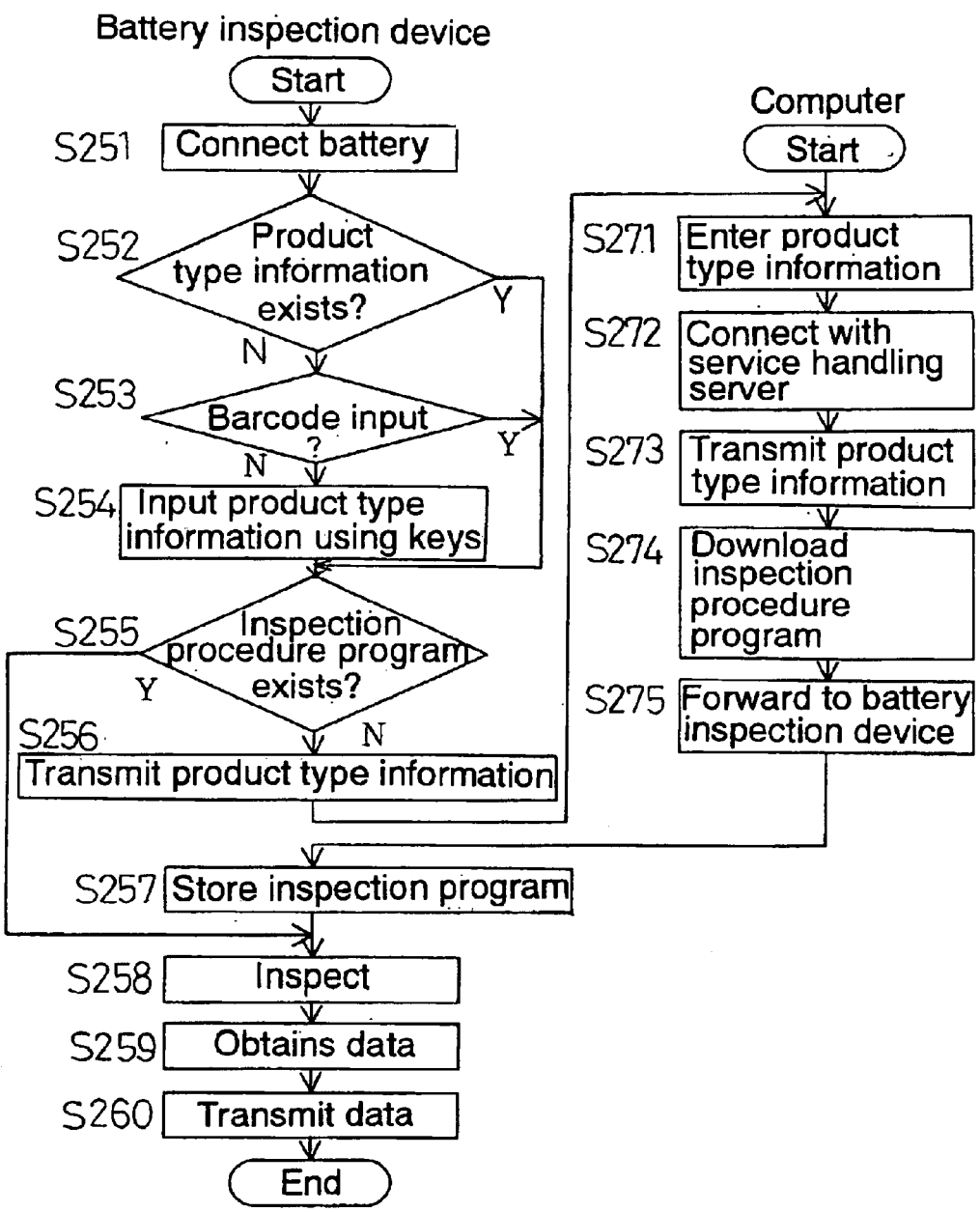
FIG. 33 is a flowchart showing a procedure of the inspection.
Figure 34:
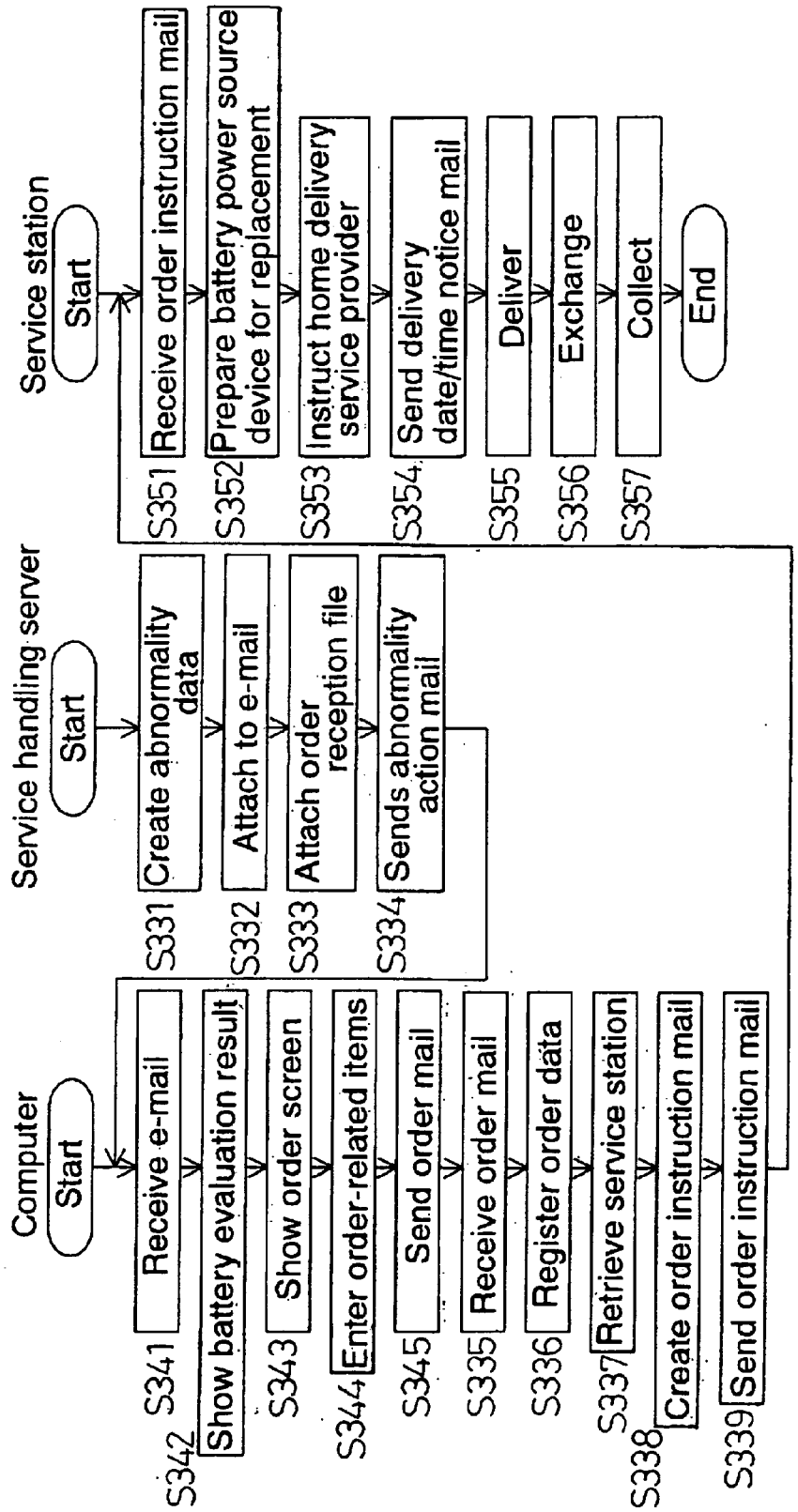
FIG. 34 is a flowchart showing a procedure of replacing a battery.

The following section describes inspection service processing for the battery 134 using the constitution above while referring to flowcharts in FIG. 33 and FIG. 34. S251, S252, . . . in the flowcharts are step numbers for indicating a processing procedure, and match numbers described in the following section.

The battery inspection device 133 is connected with the computer 132, both of them starts, and the battery 134 to be inspected is connected with the battery connection means 161 (S251) in FIG. 33. It is determined whether the inspection information memory means 165 stores the product type information on the connected battery 134 (S252), and it is determined whether a barcode entry is available if the product type information is not stored (S253). When the battery 134 is not provided with the barcode indication, the product type number shown on the battery 134 is entered from keys (S254). If the product type information is stored in the step S252, the barcode is entered in the step S253, or the key input is conducted in the step S254, the product type of the battery 134 is established, and it is determined whether the inspection procedure program corresponding to this product type is stored in the inspection information memory means 165 (S255). When the inspection information memory means 165 does not store the inspection procedure program corresponding to the product type, the product type information is transmitted from the information transmission means 164 to the computer 132 (S256).

When the product type information is transmitted to the information transmission means 138 (S271), the computer 132 uses the network connection means 135 to connect with the service handling server 150 (S272), and transmits the product type information (S273). When the WWW server/CGI 17 receives the product type information in the service handling server 150, a file retrieving part 224 starts. Then, an inspection procedure program corresponding to the product type information is obtained from the inspection procedure memory 219, and is downloaded to the computer 132 (S274). The computer 132 forwards the downloaded inspection procedure program from the information transmission means 138 to the battery inspection device 133 (S275).

The battery inspection device 133 stores the forwarded inspection procedure program in the inspection information memory means 165 (S257). Because this storing process accumulates the inspection procedure programs for the individual product types in the inspection information memory means 165, when the battery 134 of the same product type is connected, the process for obtaining the inspection procedure program through the computer 132 can be omitted, and the efficiency of the inspection increases.

The battery inspection device 133 uses the forwarded inspection procedure program to inspect the battery 134 using the battery inspection means 166 (S258). The data detection means 163 obtains the operation state data of the battery 134 in the inspection (S259). The information transmission means 164 transmits the obtained operation state data to the computer 132 (S260), and the computer 132 transmits them to the service handling server 150.

When the WWW server/CGI 17 receives the operation state data in the service handling server 150, the information processor 218 starts to open the maintenance page. Then, the information processor 218 processes the operation state data entered from the parameter analyzer 31, and creates evaluation object data. The evaluation part 33 evaluates the operation state of the battery 134 by comparing them with a database which corresponds to the product type of the battery 134, and is retrieved from the battery information DB 222 by the battery information retrieving part 232.

If the evaluation part 33 determines as normal, the reply data generator 34 generates a reply message indicating "Normal", and the WWW server/CGI 17 transmits the message to the computer 132. When the computer 132 receives the message, a display "Normal" is shown on a display. On the other hand, if it is determined as "Abnormal", the abnormality data generator 35 generates a reply message, and it is transmitted to the computer 132. Then, an abnormality managing subroutine shown in FIG. 34 is executed. The reply message in case of the abnormality appears as "Abnormal" on the display of the computer 132, and simultaneously a notice indicating that information for handling the abnormality will be provided by an e-mail is displayed.

If an abnormality of the battery 134 is detected, a processing operation for replacing and collecting the battery 134 shown in FIG. 34 is executed in the service handling server 150 as the abnormality managing subroutine. The abnormality data generator 35 generates battery abnormality data (S331) in the service handling server 150 in FIG. 34. The e-mail generator 36 retrieves a mail address of the user in the mail address DB 23 to create an e-mail to the user. The battery abnormality data (S332), and an order reception file (S333) are attached to the e-mail, and the mail server 21 transmits them as an abnormality action mail (S334).

When the computer 132 receives the abnormality action mail through a provided mailer 125 (S341), and opens it, a battery evaluation result screen for showing the battery abnormality data appears on the display of the computer 132 (S342). If the user wants to replace the battery 134 based on the determination on the abnormality state, the user opens an order screen (S343), enters order-related items into individual entries on the order screen (S344), and transmits them as an order mail from the mailer 125 to the mail server 21 (S345).

When the mail server 21 receives the order mail, the mail server 21 opens the mail, and forwards it to the service handling server 150 (S335). The order processor 37 registers the order data (S336), retrieves a service station 40 corresponding to the address of the user from the mail address DB 23 (S337), and creates an order instruction mail to the service station 40 (S338). The order instruction mail is uploaded to the mail serve 21, and is transmitted to the service station 40 (S339).

When the service station 40 receives the order instruction mail (S351), the service station 40 prepares the battery 134 for replacement described in the order instruction mail (S352), and transmits delivery data to the home delivery service provider 41 (S353). Simultaneously the service station 40 sends a delivery date/time notice mail to the computer 132 (S354). The home delivery service provider 41 receives the battery 134 from the service station 40, delivers it to the user (S355), exchanges the used battery with the replacement battery (S356), and delivers the used battery to the service station 40 to collect the used battery (S357).

Cash on delivery where the home delivery service provider 41 collects the payment on delivery, and card payment using a credit card are available for the payment of the rechargeable battery 134.

INDUSTRIAL APPLICABILITY

As described above, according to the present invention, because connecting with the service handling server through the communication network enables evaluating the degradation state of the power source device, and providing services such as management, maintenance, and advice according to the state of the power source device, the invention is effective for precisely evaluating the operation state according to the type of the battery.

What is claimed is:

1. A replacement and collection system for a battery power source device, comprising:

an electronic device serving as a client device, the electronic device including a battery power source device using a rechargeable battery, a battery management system for managing an operation state of the battery power source device, and a connection device for connecting with a communication network; and a service handling server set up on the communication network corresponding to said electronic device, wherein said electronic device makes access to the service handling server and transmits operation state data of the battery power source device provided from said battery management system, the service handling server determines whether it is necessary to replace the battery power source device based on said operation state data, and transmits replacement processing information to the electronic device if it is determined that the replacement is necessary, a user of the electronic device transmits order information specified in said replacement processing information to the service handling server when the user wants the replacement, and the service handling server instructs a service station to deliver a battery power source device, and to collect the used battery power source device based on said order information, and simultaneously instructs a payment settlement station to settle the payment.

2. A replacement and collection system for a battery power source device, comprising:

an electronic device serving as a client device, the electronic device including a battery power source device using a rechargeable battery, a battery management system for managing an operation state of the battery power source device, an identification information memory device for storing identification information for identifying a model type, and a connection device for connecting with a communication network; and a service handling server set up on the communication network, the server including databases corresponding to model types of the electronic devices and the battery power source devices, an information processor for referring provided operation state data to said database, and evaluating the operation state, and a reply information generator for generating reply information, wherein said electronic device uses said network connection device to connect with the service handling server when a maintenance operation program starts, and transmits operation state data of the battery power source device provided from said battery management system, and the identification information read out from said identification information memory device to the service handling server, said service handling server identifies model types based on the received identification information, uses said information processor to refer the operation state data to the databases corresponding to the model types to evaluate the operation state of the battery power source device, determines whether it is necessary to replace the battery power source device based on the evaluation result, uses the reply information generator to generate evaluation data and an order notice if it is determined that it is necessary to replace the battery power source device, and transmits them to the electronic device, a user of the electronic device transmits order information based on the order notice to the service handling server when the user wants to replace the battery power source device, and the service handling server forwards the order information to a replacement service station to instruct a delivery of a battery power source device for replacement, and simultaneously transmits the order information to a payment settlement organization to instruct the settlement of the payment.

3. The replacement and collection system for a battery power source device according to claim 2, wherein the electronic device is a portable personal computer, and makes access to the service handling server through the Internet.

4. The replacement and collection system for a battery power source device according to claim 2, wherein the electronic device is a portable information terminal, and makes access to the service handling server through the Internet.

5. The replacement and collection system for a battery power source device according to claim 2, wherein the electronic device is a mobile communication device, and makes access to the service handling server through a data communication service.

6. A battery maintenance service system for an electric-powered vehicle, comprising:

an electric-powered vehicle serving as a client device, the vehicle including a rechargeable battery, a battery management system for monitoring an operation state of the rechargeable battery, an identification information memory device for storing identification information for identifying the vehicle model, and a network connection device for connecting with a communication network; and a service handling server set up on the communication network, wherein the electric-powered vehicle uses said network connection device to make access to the service handling server, and transmits battery management information provided from said battery management system, and the identification information read out from the identification information memory to the server, and the service handling server refers the transmitted battery management information to databases provided in advance for individual vehicle models to determine the operation state of the rechargeable battery, and transmits a determination result and action information in case of detecting an abnormality in at least one of the electric-powered vehicle and the rechargeable battery reflected in the transmitted battery management data.

7. The battery maintenance service system for an electric-powered vehicle according to claim 6, wherein the electric-powered vehicle includes a car navigation device, and transmits position information detected by the car navigation device to the service handling server, and the service handling server returns position information of the nearest service station as the action information in case of detecting an abnormality.

8. The battery maintenance service system for an electric-powered vehicle according to claim 6, wherein the service handling server transmits determination data and order processing information as the action information to the electric-powered vehicle when it is determined that the rechargeable battery is degraded, returns position information of the nearest service station when order information on the rechargeable battery is received from the electric-powered vehicle, and guides the electric-powered vehicle to the service station for replacing and collecting the used battery.

9. A maintenance service system for a battery power source device, comprising:

a battery power source device including a rechargeable battery a battery management system for monitoring an operation state of the rechargeable battery, and an identification information memory device for storing identification information for identifying a model type;

an electronic device provided with a connection function for connecting with a communication network, and connected with the battery power source device through a signal connection device; and a service handling server set up on the communication network, wherein said electronic device serving as a client device is connected with the service handling server, and transmits battery management information provided from said battery management system, and the identification information read out from said identification information memory device to the service handling server through said signal connection device, said service handling server refers the transmitted battery management information to databases provided in advance for individual model types to determine the operation state of the rechargeable battery, and returns a determination result and action information in case of detecting an abnormality in at least one of the client device and the rechargeable battery reflected in the battery management information, and the service handling server transmits determination data and order processing information as the action information to the electronic device when the server determines that the rechargeable battery is degraded, and the service handling server instructs a service station to deliver a replacement battery, and to collect the used battery, and conducts payment settlement processing when it receives order information on the rechargeable battery from the electronic device.

10. The maintenance service system for a battery power source device according to claim 9, wherein the battery power source device is an uninterruptible power supply using the rechargeable battery, the electronic device is a computer, and the signal connection device is an interface for connecting them with each other.

11. The maintenance service system for a battery power source device according to claim 9, wherein the battery power source device is a battery power source for a handset of a cordless telephone, the electronic device is a main unit of the cordless telephone, and the signal connection device is a wireless communication channel for connecting them with each other.

12. A maintenance service system for a battery power source device, comprising:

an electronic device including a battery power source device, and a read/write device for a memory medium;

an information device including a read/write device for the memory medium, and a connection function for connecting with a communication network; and a service handling server set up on the communication network for the information device as a client device, wherein said battery power source device includes a rechargeable battery, a battery management system for managing an operation state of the rechargeable battery, and an identification information memory device for storing identification information for identifying a model type, said electronic device uses the read/write device to record battery management information extracted from the battery management system, and the identification information extracted from the identification information memory device into the memory medium, the information device uses the connection function for connecting with the communication network to connect with the service handling server, and transmits the battery management information and the identification information read out from the memory medium through the read/write device to the service handling server when the memory medium is connected with the read/write device of the information device, said service handling server refers the transmitted battery management information to databases provided in advance for the individual model types identified by the identification information, determines the operation state of the rechargeable battery, and returns a determination result and action information in case of detecting an abnormality in at least one of the information device and the rechargeable battery, the service handling server transmits determination data and order processing information as the action information when the service handling server determines that the rechargeable battery is degraded, and the service handling server instructs a service station to deliver a replacement battery and to collect the used battery, and conducts payment settlement processing when the service handling server receives order information on the rechargeable battery from the information device.

13. The maintenance service system for a battery power source device according to claim 12, wherein the electronic device is an imaging device for storing image data into the memory medium.

14. The maintenance service system for a battery power source device according to claim 12, wherein the electronic device is an audio recording device for recording audio data into the memory medium.

15. The maintenance service system for a battery power source device according to claim 12, wherein the information device is a computer.

16. A maintenance service system for a battery, comprising:
   a battery inspection device connected with a battery subject to inspection;
   a computer connected with the battery inspection device through an information transmission device, the computer including a connection device for connecting with a communication network; and
   a service handling server set up on the communication network for the computer serving as a client device, wherein
   an inspection procedure corresponding to a product type of the battery connected with said battery inspection device is obtained into the battery inspection device from the service handling server through the computer,
   operation state data for the battery inspected following the inspection procedure information is transmitted to the service handling server through the computer,
   the service handling server determines whether the battery is good or bad based on the operation state data, and transmits a determination result to the computer, and
   the computer shows the determination result on a display.

17. A maintenance service system for a battery, comprising:
   a battery inspection device including a battery connector to be connected with a battery subject to inspection, a product type input device for entering product type information on the battery connected with the battery connector, an inspection information memory device for storing information necessary for the inspection, a battery inspection system for using an inspection procedure program to inspect the battery, a data detection device for detecting operation state data of the battery obtained by the inspection, and an information transmission device for receiving and providing information;
   a computer including a network connection device for connecting with a communication network, and an information transmission device for providing and receiving information; and
   a service handling server setup on the communication network for said computer serving as a client device, the server including an inspection procedure storage for storing the inspection procedures for the individual product types of the batteries, a database for storing data for the individual product types of the batteries, and an evaluation system for referring the operation state data of the battery to said database to evaluate the operation state, wherein
   said battery inspection device and said computer are connected with each other through the information transmission devices of each of them,
   the battery is connected with the battery connector of the battery inspection device,
   the product type of the battery is entered from the product type input device,
   the information transmission devices transmit the product type of the battery to the computer,
   the computer uses said network connection device to connect with the service handling server, downloads the inspection procedure program corresponding to the product type from said inspection procedure storage, and transmits the program to the battery inspection device through the information transmission device,
   the battery inspection device stores the inspection procedure program in the inspection information memory device, uses the program to inspect the battery connected with the battery connector, uses said data detection device to detect the obtained operation state data of the battery, and uses the information transmission devices to transmit the operation data to the computer,
   the computer connects with the service handling server, and transmits the operation state data,
   the service handling server uses said evaluation system to refer the transmitted operation state data to said database, evaluates the operation state of the battery, and transmits an evaluation result to the computer, and
   the computer shows the evaluation result on a display.

18. The maintenance service system for a battery according to claim 17, wherein the product type input device is a barcode reader for reading a barcode recorded on the battery.

19. The maintenance service system for a battery according to claim 17, wherein the inspection information memory device stores the product type information, and the input of the product type information is omitted when the product type information on the battery connected with the battery connector is stored.

20. The maintenance service system for a battery according to claim 17, wherein the service handling server transmits order processing information along with the evaluation result to the computer when the service handling server determines that the battery is degraded, and instructs a service station to deliver a replacement battery, and to collect the used battery, and conducts payment settlement processing when it receives order information on the battery from the computer.

21. The battery maintenance service system for ah electric-powered vehicle according to claim 6, wherein the service handling server transmits a determination result and action information in case of detecting an abnormality in any one of both the electric-powered vehicle and the rechargeable battery reflected in the transmitted battery management data.

22. The maintenance service system for a battery power source device according to claim 9, wherein said service handling server returns a determination result and action information in case of detecting an abnormality in any one of both the client device and the rechargeable battery reflected in the battery management information.

23. The maintenance service system for a battery power source device according to claim 12, wherein said service handling server returns a determination result and action information in case of detecting an abnormality in any one of both the information device and the rechargeable battery.

* * * * *